(12) United States Patent
Banerjee et al.

(10) Patent No.: US 11,094,881 B2
(45) Date of Patent: Aug. 17, 2021

(54) CHEMICAL VAPOR DEPOSITION OF PEROVSKITE THIN FILMS

(71) Applicants: Parag Banerjee, St. Louis, MO (US); Peifu Cheng, St. Louis, MO (US); Xiao Chen, St. Louis, MO (US); Yoon Myung, St. Louis, MO (US)

(72) Inventors: Parag Banerjee, St. Louis, MO (US); Peifu Cheng, St. Louis, MO (US); Xiao Chen, St. Louis, MO (US); Yoon Myung, St. Louis, MO (US)

(73) Assignee: Washington University, St. Louis, MO (US)

( * ) Notice: Subject to any disclaimer, the term of this patent is extended or adjusted under 35 U.S.C. 154(b) by 321 days.

(21) Appl. No.: 16/111,558

(22) Filed: Aug. 24, 2018

(65) Prior Publication Data

US 2019/0074439 A1   Mar. 7, 2019

Related U.S. Application Data

(60) Provisional application No. 62/550,222, filed on Aug. 25, 2017.

(51) Int. Cl.
  *H01L 45/00* (2006.01)
  *C23C 16/30* (2006.01)
(52) U.S. Cl.
  CPC ......... *H01L 45/1616* (2013.01); *C23C 16/30* (2013.01); *H01L 45/14* (2013.01)
(58) Field of Classification Search
  CPC .... H01L 45/1616; H01L 45/14; H01L 45/147
  See application file for complete search history.

(56) References Cited

U.S. PATENT DOCUMENTS

| | | | | |
|---|---|---|---|---|
| 2016/0155974 A1* | 6/2016 | Wang | ................ | H01L 51/4226 136/263 |
| 2017/0077182 A1* | 3/2017 | Strukov | ................ | H01L 45/08 |
| 2019/0019081 A1* | 1/2019 | Kim | ................ | G06N 3/0481 |

OTHER PUBLICATIONS

Brandt et al., "Identifying defect-tolerant semiconductors with high minority carrier lifetimes: Beyond hybrid lead halide perovskites", MRS Commun., 2015, vol. 5, pp. 265-275.

Chen et al., "Atmospheric pressure chemical vapor deposition of methylammonium bismuth iodide thin films", J. Mater. Chem. A, 2017, vol. 5, pp. 24728-24739.

Eckhardt et al., "Crystallographic insights into (CH3NH3)3(Bi2I9): a new lead-free hybrid organic-inorganic material as a potential absorber for photovoltaics", Chem. Commun., 2016, vol. 52, pp. 3058-3060.

Ganose et al., "Beyond methylammonium lead iodide: prospects for the emergent field of ns2 containing solar absorbers", Chem. Commun., 2017, vol. 53, pp. 20-44.

Hoye et al., "Methylammonium Bismuth Iodide as a Lead-Free, Stable Hybrid Organic-Inorganic Solar Absorber", Chem. Eur. J., 2016, vol. 22, pp. 2605-2610.

(Continued)

*Primary Examiner* — Errol V Fernandes
(74) *Attorney, Agent, or Firm* — Armstrong Teasdale LLP

(57) ABSTRACT

Perovskite films are known to be useful in many different technologies, including solar panels and memristors. Most perovskites contain lead which is undesirable for many reasons. It has been found that bismuth can be used in place of lead in preparing perovskite thin films. Additionally, when chemical vapor deposition is used to prepare the films instead of traditional solution phase methods, the films show greatly improved performance in electronic applications. Additionally, the present disclosure is directed to the use of perovskites in memory devices.

7 Claims, 29 Drawing Sheets

(56) References Cited

OTHER PUBLICATIONS

Huang et al., "Band Gap Insensitivity to Large Chemical Pressures in Ternary Bismuth Iodides for Photovoltaic Applications", J. Phys. Chem. C, 2016, vol. 120, pp. 28924-28932.

Kulkarni et al., "Photovoltaic enhancement of bismuth halide hybrid perovskite by N-methyl pyrrolidone-assisted morphology conversion", RSC Adv., 2017, pp. 9456-9460, vol. 7.

Lehner et al., "Crystal and Electronic Structures of Complex Bismuth Iodides $A_3Bi_2I_9$ (A = K, Rb, Cs) Related to Pervoskite: Aiding the Rational Design of Photovoltaics", Chem. mater., 2015, vol. 27(20), pp. 7137-7148.

Liu et al., "Efficient planar heterojunction perovskite solar cells by vapour deposition", Nature, 2013, vol. 501, pp. 395-398.

Lyu et al., "Organic-inorganic bismuth (III)-based material: A lead-free, air-stable and solution-processable light-absorber beyond organolead perovskites", Nano Research, 2016, pp. 692-702, vol. 9(3).

Niu et al., "Controlled Growth and Reliable Thickness-Dependent Properties of Organic-Inorganic Perovskite Platelet Crystal", Adv. Funct. Mater., 2016, vol. 26, pp. 5263-5270.

Okano et al., "Gas-assisted coating of Bi-based $(CH_3NH_3)_3Bi_2I_9$ active layer in perovskite solar cells", Materials Letters, 2017, vol. 191, pp. 77-79.

Park et al., "Bismuth Based Hybrid Perovskites $A_3Bi_2I_9$ (A: Methylammonium or Cesium) for Solar Cell Application", Adv. Mater., 2015, vol. 27, pp. 6806-6813.

Xiao et al., "Searching for promising new perovskite-based photovoltaic absorbers: the importance of electronic dimensionality", Mater. Horiz., 2017, vol. 4, pp. 206-216.

Zhao et al., "Solution Chemistry Engineering toward High-Efficiency Perovskite Solar Cells", J. Phys. Chem. Lett., 2014, vol. 5, pp. 4175-7186.

Zuo et al., "Lead-free Perovskite Materials $(NH_4)_3Sb_2I_xBr_{9-x}$", Angew. Chem. Int. Ed., 2017, vol. 56, pp. 5528-6532.

\* cited by examiner

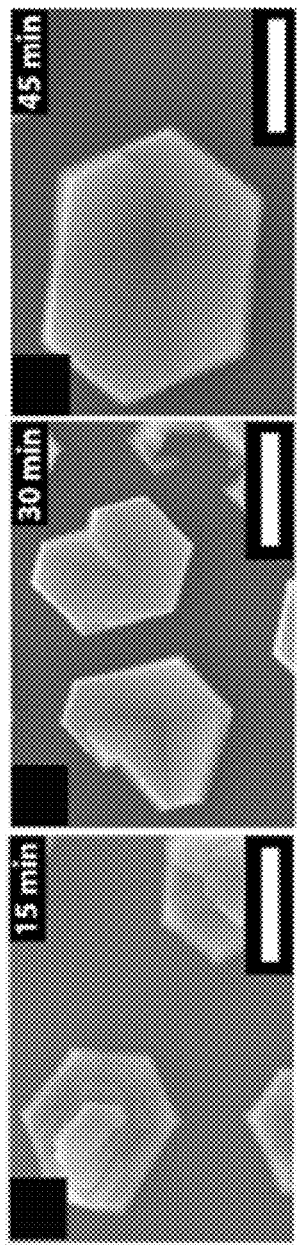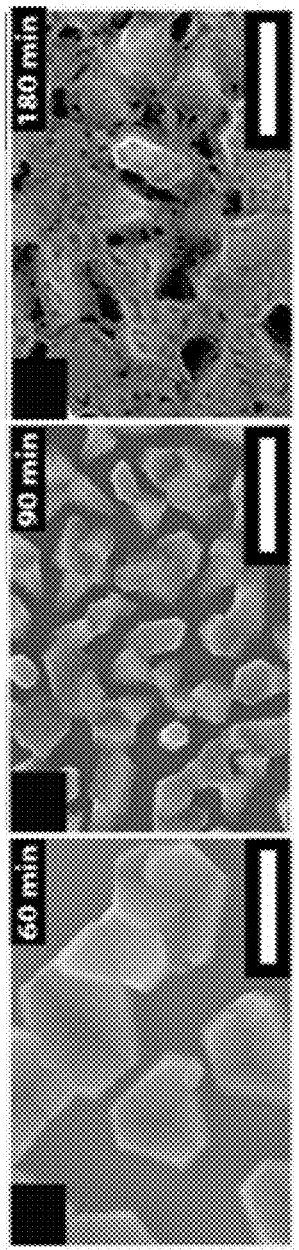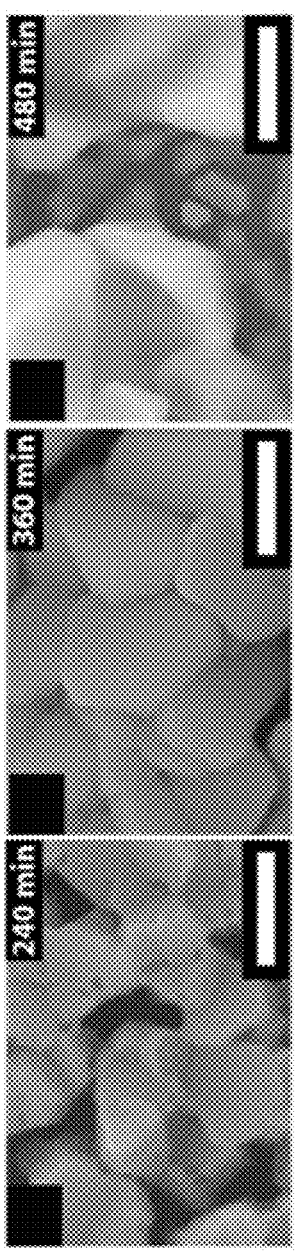

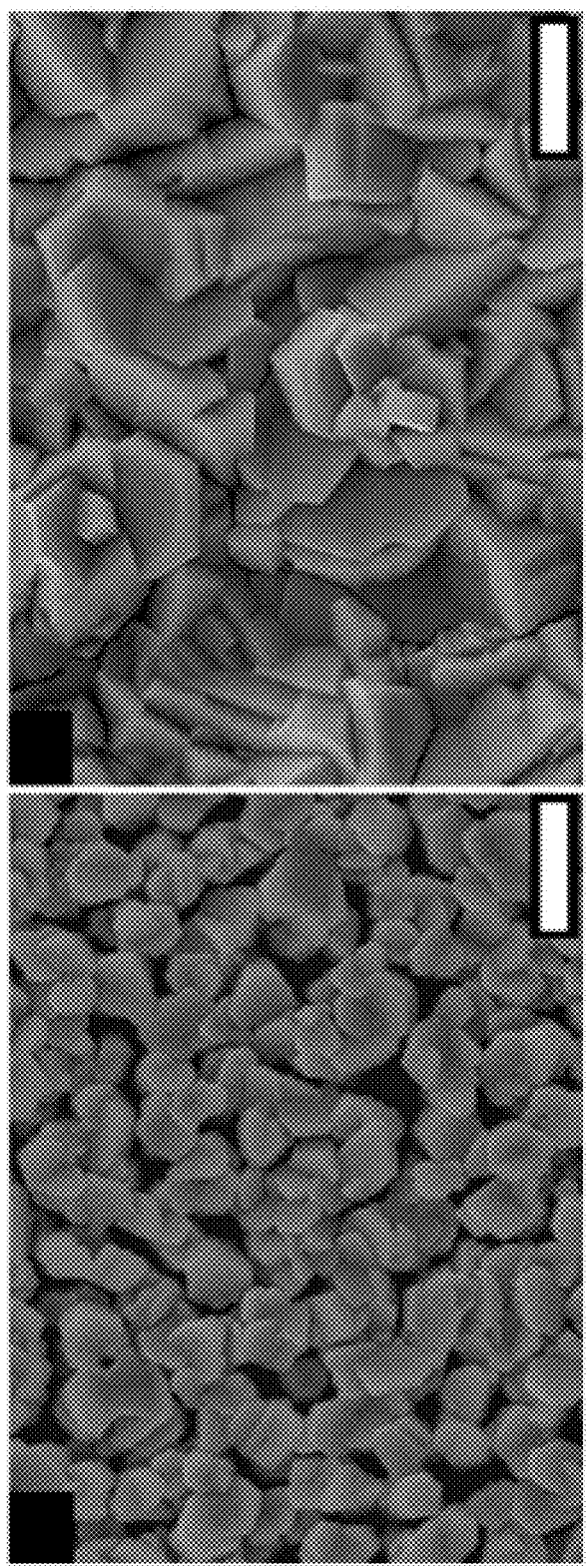

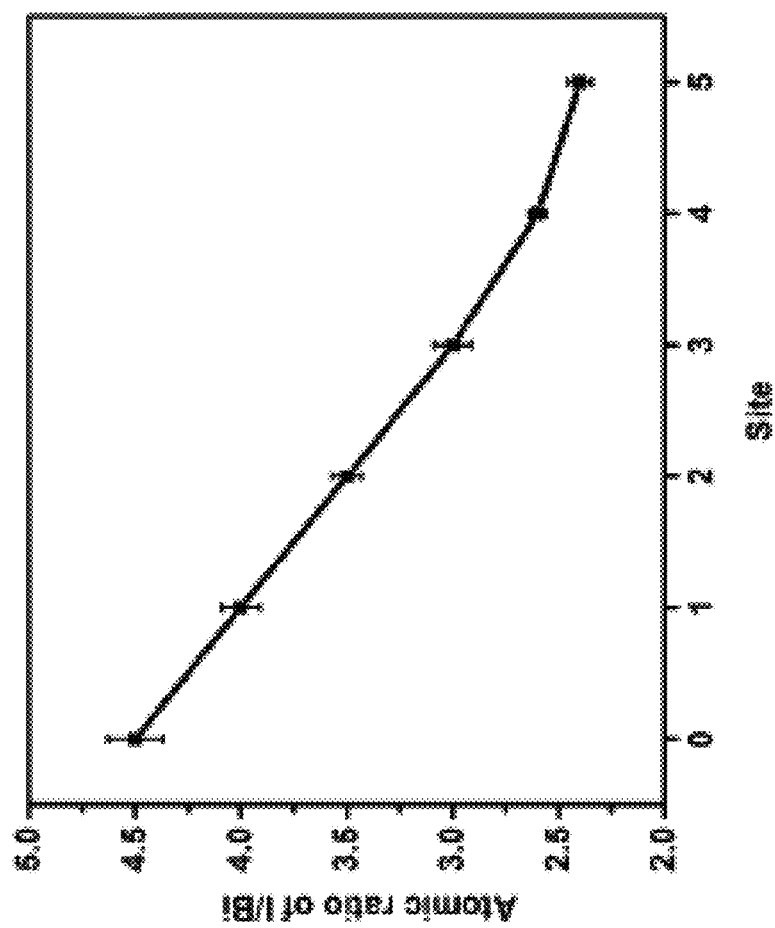
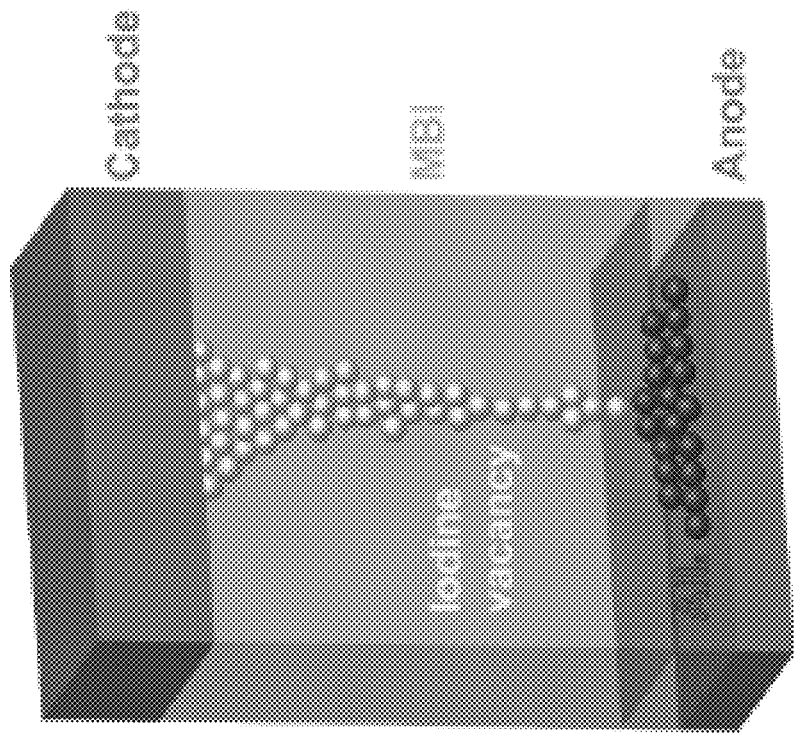
FIG. 19E
FIG. 19F

CHEMICAL VAPOR DEPOSITION OF PEROVSKITE THIN FILMS

CROSS-REFERENCE TO RELATED APPLICATION

This application claims the benefit of U.S. Provisional Patent Application Ser. No. 62/550,222, filed Aug. 25, 2017, the entire contents of which are incorporated herein by reference.

STATEMENT REGARDING FEDERALLY SPONSORED RESEARCH & DEVELOPMENT

This invention was made with government support under grant DE-AC36-08GO28308 awarded by Office of Science, Office of Basic Energy Sciences, and Energy Efficiency and Renewable Energy, Solar Energy Technology Program, grant IUSSTF/JCERDC-SERIIUS/2012 awarded by Department of Science and Technology, Government of India, grant W911NF-15-1-0178, subgrant RSC15032 awarded by U.S. Army RDECOM, and grant number ACI-1053575 awarded by the National Science Foundation. The government has certain rights in the invention.

BACKGROUND

The field of the disclosure relates generally to the formation of perovskite thin films using bismuth instead of lead. It discloses the use of chemical vapor deposition to prepare perovskite thin films having improved properties compared to perovskite films prepared using traditional solution phase methods. Furthermore, the present disclosure is directed to the use of perovskites in memory devices.

Lead halide perovskites ($CH_3NH_3PbI_3$ or $MAPbI_3$ and its variants) are promising solar-cell absorber materials with reported power conversion efficiencies that have rapidly increased from 3.8% in 2009, to an impressive 22.1% in 2017. The fundamental material properties in lead halide perovskites that drive such progress are its high charge-carrier mobilities, high optical absorption coefficient, ideal and tunable bandgap and ultra-long carrier diffusion lengths up to a few microns.

Though the reported power conversion efficiencies of lead halide perovskite solar cells are now competitive with commercial silicon solar cells, there are two limitations preventing the commercialization of such solar cells. These are (1) the environmental, device and thermodynamic instability of the perovskites in the presence of air, humidity, light and electric fields; and (2), the toxicity due to the presence of lead. Attempts to address stability limitations have included replacing the A-site organic component ($CH_3NH_3^+$) with inorganic cations, such as $Cs^+$ and $Rb^+$ or by providing protective overlayers that prevent exposure of lead halide perovskite films to ambient conditions. However, the toxicity due to the presence of lead in these perovskites presents a challenge to further scale-up and eventual commercialization.

Bismuth ($Bi^{3+}$) has drawn attention as a substituent to the B-site occupied by $Pb^{2+}$ for 'lead-free' perovskites, since it is a non-toxic 6p-block element that is isoelectronic with $Pb^{2+}$. Reports on optoelectronic and photovoltaic properties of methylammonium bismuth iodide $(CH_3NH_3)_3Bi_2I_9$ ($MA_3Bi_2I_9$) with high absorption coefficient and long term stability have been published; however, $MA_3Bi_2I_9$ based solar cells suffer from low efficiency. Besides the suboptimal electronic structure of $MA_3Bi_2I_9$ compared to $MAPbI_3$, the diminished performance of the solar-cells is also attributed to the commonly used solution deposition techniques that result in poor morphology, purity and coverage of the films on substrate.

Materials innovation is a driver for new memristor technology with direct impact on design of neuromorphic computing circuits and development of ubiquitous devices on the internet-of-things platform. Memristor research has unraveled many fascinating mechanisms that can give rise to binary conducting states in materials including, metal filamentary fuse-antifuse behavior, O-vacancy migration across metal oxides, and Mott transitions.

Organic-inorganic hybrids have attracted considerable attention due to their potential as absorber materials in solar cells. Charged organic moieties are atomically contiguous to inorganic, ionic charge centers and manipulation of the size and species of each of these components, can lead to a vast palette of structures and properties.

Thus, there is a need for improved perovskites that eliminate lead and are amenable to large scale preparation and commercialization. Additionally, there is a need for a new and improved memristor that will have applications across many different technologies.

Furthermore, bismuth ($Bi^{3+}$) has been considered to be a strong competitor to replace lead owing to its diminished toxicity, improved stability and similar electronic configuration as $Pb^{2+}$. However, so far, bismuth-based halide materials have been rarely reported to fabricate resistive switching memories, only two types of bismuth-based halide films have been demonstrated memristive performance. Furthermore, their performances, such as ON/OFF ratios ($<10^3$), are still not comparable to that of a $MAPbI_3$ based memory device. More fundamentally, the nature of resistive switching behavior in bismuth-based halide perovskite memory devices has not been clarified yet.

Resistive random-access memory (ReRAM) has emerged as one of the most promising candidates for next-generation non-volatile memories and neuromorphic computing circuits, owing to its simple architecture, low power consumption, high integration density, rapid switching speed, excellent endurability, and outstanding scaling property. Resistive switching effect, originating from a sudden resistance change of a dielectric under a strong electric field or current, is the basis of ReRAM. Among various materials, inorganic oxides, especially inorganic perovskites, such as $SrZrO_3$:Cr, $SrRuO_3$ and $BiFeO_3$, have been investigated as the active layer for resistive switching memory devices because of their excellent resistive switching performance. But, oxide-based inorganic perovskites rely on high-temperature vacuum-based deposition synthesis (>450° C.) and form brittle rigid films, thus limiting their application to rigid substrates. However, future technologies including ubiquitous electronics and the Internet of Things (IoT) require flexible devices fabricated on soft substrates, which are usually unstable at high temperature. To overcome this issue, some have employed a low-temperature (100° C.) solution-processable method to produce organic-inorganic halide $MAPbI_{3-x}Cl_x$ perovskites for a resistive switching memory device with flexible feature.

Organic-inorganic halide perovskites have attracted attention since first applied $MAPbBr_3$ and $MAPbI_3$ to photovoltaic devices. The combined advantages of organic (flexibility, low-cost synthesis) and inorganic (high mobility, crystallinity, thermal stability) constituents present in these hybrid perovskites generate unique properties, thus leading to a variety of applications such as solar cells, light-emitting diodes (LEDs), field effect transistors (FETs), photodetectors, rechargeable batteries, lasers, X-ray detectors, artificial synaptic devices, and non-volatile memories. To date, organolead halide perovskites (OHPs) are the most studied organic-inorganic halide perovskite materials in the field of non-volatile memory. Notably, the resistance change of resistive switching memory using OHP, in particular, methylammonium lead iodide (MAPbI$_3$) has achieved up to $10^7$. Nevertheless, the toxicity of lead as well as the instability of MAPbI$_3$ in the presence of moisture and oxygen restricts the further scale-up and commercialization. Therefore, it is imperative to replace lead by less toxic elements and simultaneously enhance film stability.

BRIEF DESCRIPTION OF THE DISCLOSURE

In one aspect, disclosed herein is a memristor device comprising a perovskite film.

In some aspects, disclosed herein is a perovskite film, said film comprising methylammonium bismuth iodide (CH$_3$NH$_3$)$_3$Bi$_2$I$_9$.

In yet another aspect, disclosed herein is method for making a perovskite film on a substrate using chemical vapor deposition, said method comprising passing a gas over a first precursor and a second precursor thereby forming a gas and precursor mixture, passing a gas over a first precursor and a second precursor thereby forming a gas and precursor mixture, wherein the first precursor is upstream in the gas flow relative to the second precursor, the second precursor is upstream in the gas flow relative to the substrate, and the gas is flowing from upstream to downstream; maintaining a temperature of the gas and precursor mixture above a predetermined value wherein the first precursor, the second precursor and the substrate may each independently have a different predetermined temperature; and passing the gas and precursor mixture over the substrate for a predetermined period of time thereby depositing the perovskite film on said substrate.

In yet another aspect, a resistive switching memory device comprising a MA$_3$Bi$_2$I$_9$ film is disclosed.

BRIEF DESCRIPTION OF THE DRAWINGS

FIGS. 3A, 3B, 3C, 3D, 3E, 3F, 3G, 3G, and 3I are exemplary embodiments of a series of SEM images for an APCVD film at different time points in accordance with the present disclosure.

FIG. 4A is an exemplary embodiment of a low magnification image of a MA$_3$Bi$_2$I$_9$ thin film after 360 minutes in accordance with the present disclosure. FIG. 4B is an exemplary embodiment of a low magnification of the same film after a second deposition in accordance with the present disclosure.

FIG. 18A is an exemplary embodiment of a schematic structure of an Al/MBI/Au device in accordance with the present disclosure. The cross-sectional SEM image shows the side view of an MBI film deposed in an Au substrate in accordance with the present disclosure. FIG. 18B is an exemplary embodiment of I-V characteristic of an Al/MBI/Au device at 25° C. in accordance with the present disclosure. FIG. 18C is an exemplary embodiment of I-V characteristic of an Al/MBI/Au device in the logarithmic scale at 25° C. in accordance with the present disclosure. FIG. 18D is an exemplary embodiment of an endurance test of an Al/MBI/Au device for 1000 cycles in accordance with the present disclosure. FIG. 18E is an exemplary embodiment of the retention property of an Al/MBI/Au device at 25° C. in accordance with the present disclosure. FIG. 18F is an exemplary embodiment the variation of series resistance ($R_s$, red) at ON state and parallel resistance ($R_p$, black) at OFF state as a function of frequency of an Al/MBI/Au device at 25° C. in accordance with the present disclosure.

FIG. 19E is an exemplary embodiment of a quantitative I/Bi ratio around five sites at ON state, site 0 represents OFF state in accordance with the present disclosure. FIG. 19F is an exemplary embodiment of a schematic illustration of the proposed mechanism of iodine vacancies diffusion in accordance with the present disclosure.

DETAILED DESCRIPTION OF THE DISCLOSURE

Figure 1A:
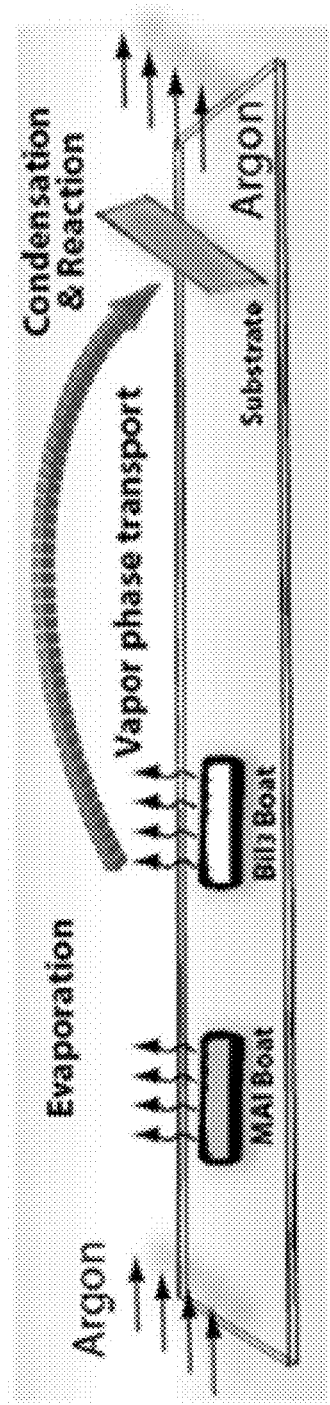
FIG. 1A is an exemplary embodiment of a schematic of an APCVD for MA$_3$Bi$_2$I$_9$ thin films in accordance with the present disclosure.

Perovskite films are known to be useful in many different technologies, including solar panels and memristors. Most perovskites contain lead which is undesirable for many reasons. It has been found that bismuth can be used in place of lead in preparing perovskite thin films. Additionally, when chemical vapor deposition is used to prepare the films instead of traditional solution phase methods, the films show greatly improved performance in electronic applications.

The present disclosure is also directed to designing and fabricating a resistive switching memory device using $MA_3Bi_2I_9$ (MBI) thin films as the active layer.

Definitions

The term "memristor" as used herein refers to a fourth class of electrical circuits that exhibit unique properties primarily at the nanoscale. The other three circuits are the resistor, the capacitor, and the inductor. Memristors are a non-linear passive two-terminal electrical component relating electric charge and magnetic flux linkage. Theoretically, memristors are a type of passive circuit elements that maintain a relationship between the time integrals of current and voltage across a two terminal element. Thus, a memristors resistance varies according to a devices memristance function, allowing, via tiny read charges, access to a "history" of applied voltage. A relatively new phenomena, memristance was first postulated in the 1970s, but has only become an important aspect in electronics with the advent of nanoscale technology. The first device to actually incorporate a memristor was not manufactured until 2008.

The term "perovskite" as used herein refers to any material having the same crystal structure as calcium titanium oxide ($CaTiO_3$), known as the perovskite structure, or $^{XII}A^{2+VI}B^{4+}X^{2-}_3$ with the anion in the face centers. The general chemical formula for a perovskite is $ABX_3$ where 'A' and 'B' are cations of different sizes and 'X' is an anion that binds to both. The 'A' cation is larger having a 12-fold cubo-octahedral coordination, while than the 'B' cation is small having a 6-fold octahedral coordination. Although naturally occurring perovskites have an oxygen anion, novel perovskites having different anions have been prepared. Because of the differences in the cations and anions, perovskite materials have been made having a large variety of interesting and useful properties, including magnetoresistance, ferroelectricity, superconductivity, charge ordering, spin dependent transport, and high thermopower. They have been used in many different applications including sensors and catalyst electrodes. Only recently have researchers begun considering them for use in microelectronic and photovoltaic applications. Currently perovskites used in solar applications require lead, a toxic and environmentally unfriendly element.

The term "halide" as used herein refers to all traditional halides—fluorine, chlorine, bromine, and iodine. The term "alkyl" as used herein refers to a straight or branched chain alkyl moiety containing from 1 to 10 carbon atoms. Examples of alkyl groups include, but are not limited to, methyl, ethyl, n-propyl, isopropyl, n-butyl, isobutyl, secbutyl, n-pentyl, -methylbutyl, 2,2-dimethylbutyl, 2-methylpentyl, 2,2-dimethylpropyl, n-hexyl and the like. The term "aryl" as used herein refers to a monocyclic or bicyclic carbocyclic ring system having one or more aromatic rings including, but not limited to, phenyl, naphthyl, tetrahydronaphthyl, indanyl and the like. The aromatic ring can be substituted or unsubstituted with one or more groups that may be the same or different from one another and are selected from the group consisting of alkyl, alkoxy, halide, alkylhalides, and aryl.

Figure 1B:
FIG. 1B is an exemplary embodiment of an image from inside a tube furnace in accordance with the present disclosure.
Figure 1C:
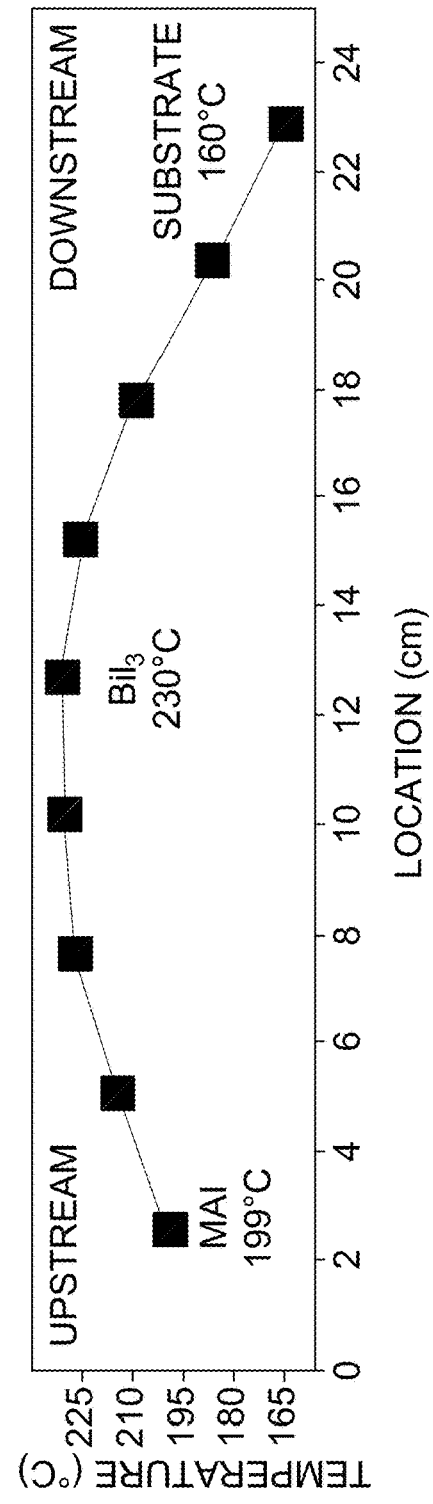
FIG. 1C is an exemplary embodiment of a temperature profile inside the tube furnace in accordance with the present disclosure.

Chemical vapor deposition is a technique known for producing high purity and high quality materials in many industries, including electronics and semiconductors. In a common arrangement, a precursor is sublimed or vaporized using heat, vacuum or both under a flow of gas that carries the gaseous vapor to a substrate where it is deposited. In some aspects disclosed herein, at least one precursor is vaporized in the process. In other aspects, at least two precursors are vaporized in the process. Vaporization can be done under vacuum or at atmospheric pressure. If done under vacuum, the pressure is selected so as to be effective in subliming the precursor or precursors. In other aspects, sublimation of the precursor is done at atmospheric pressure. For all aspects, the temperature of the furnace will be such that sublimation occurs in the one or more precursors. For multiple precursors, different temperatures can be used in different regions of the furnace and each temperature is selected independently of any other temperature. Shown in FIGS. 1A and 1B is one embodiment showing two precursors placed sequentially in the gas flow at an elevated temperature. A temperature gradient is present as shown in FIG. 1C with one precursor at one temperature, the second precursor at a second temperature, and the substrate at a third temperature.

It is recognized that all materials have a vapor pressure that, in most cases, increases with increasing temperature. In some cases herein, a precursor will sublime at the temperature of the furnace, while, in other instances, the vapor of the precursor will be due to the vapor pressure of the precursor. In either instance, for the embodiments disclosed herein, the only issue is that a gaseous state of a precursor forms. It may be due to either sublimation or the natural vapor pressure of the precursor. Deposition is the opposite of vaporization and sublimation. It denotes a phase change from vapor to a solid state.

As used here, the term "precursor" refers to the raw materials used in the CVD process. If more than one precursor is used in the process, the precursors may or may not react with each other during the CVD process.

During the CVD process, a gas is passed over the precursor or precursors to act as a carrier for the vaporized precursor. The gas will carry the vaporized precursor(s) from upstream to downstream where the substrate is located. The gas may be inert or reactive. Examples of inert gases include, but are not limited to, argon, nitrogen and helium. Examples of reactive gases include, but are not limited to, oxygen and hydrogen.

In one aspect disclosed herein is a method for making a perovskite film using atmospheric pressure chemical vapor deposition (APCVD). In some aspects, the perovskite film does not comprise lead. The method comprises passing a gas over a first precursor and a second precursor thereby forming a gas and precursor mixture, wherein the first precursor is upstream in the gas flow relative to the second precursor, the second precursor is upstream relative to the substrate, and the gas is flowing from upstream to downstream; maintaining a temperature above a predetermined value wherein the first precursor, the second precursor and the substrate may each independently have a different predetermined temperature; and passing the gas and precursor mixture over the substrate for a predetermined period of time thereby causing the perovskite film to deposit on said substrate.

The CVD process is carried out in a tube furnace or other suitable location as is known in the art. The temperature of the system can be constant throughout or it can vary based on the location in the system. In some embodiments, a temperature gradient will form inside a tube furnace. In some embodiments, the tube furnace is a single zone furnace; in other aspects, the tube furnace can be multi-zone.

The precursors for the CVD process are selected based on the desired characteristics of the final film formed on the substrate. In some embodiments, the precursors are selected from the group consisting of alkylammonium halides, arylammonium halides, alkylarylammonium halides, and metal halides. In some embodiments, the ammonium halides are substituted with up to four alkyl groups, four aryl groups, or any combination thereof, and each alkyl or aryl group may be the same or different than any other group. The ammonium halides are selected such that the halide form a stable compound that can be vaporized under CVD conditions. Specific examples of ammonium halides include, but are not limited to, methylammonium iodide, ethylammonium iodide, diethylammonium iodide, n-propylammonium iodide, i-propylammonium iodide, n-butylammonium iodide, i-butylammonium iodide, phenylammonium iodide, methylammonium bromide, ethylammonium chloride, diethylammonium fluoride, n-propylammonium bromide, i-propylammonium chloride, n-butylammonium fluoride, i-butylammonium bromide, phenylammonium bromide, and methylphenylammonium bromide. The metal halides are selected such that the metal and halide form a stable compound that can be vaporized under CVD conditions. Examples include, but are not limited to bismuth (III) iodide, gallium (III) fluoride, iron(III) chloride, molybdenum chloride, zinc chloride, tungsten (V) chloride, niobium (IV) fluoride, tantalum (V) fluoride, tantalum (V) bromide, aluminum bromide, titanium (IV) bromide, aluminum iodide, and silicon tetraiodide. Preferably the precursors are methylammonium iodide and bismuth (III) iodide. In a method where more than one precursor is used, any precursor disclosed herein can be the first or second precursor. The order of the precursors is selected based on the physical properties of the precursors and the target profile of the film formed in the process. By way of example and not limitation, in one embodiment, MAI is the first precursor and $BiI_3$ is the second precursor. Alternatively, $BiI_3$ is the first precursor and MAI is the second precursor.

In some aspects, the first precursor and the second precursor are placed side by side in the gas flow, while in other aspects the first precursor and the second precursor are placed sequentially with the gas flowing over the first precursor before the second precursor. When the first and second precursors are placed in the gas flow sequentially, the distance between the two precursors can be any suitable distance that is selected based on the nature of the furnace, the temperature profile of the furnace, the flow rate of the gas, or any other parameter necessary to generate a film with the target properties.

The flow of gas is at a rate selected to give optimal film deposition and may be constant or variable during the CVD process. In some aspects, the gas flow rate is at least about 25 $cm^3$/min. In other aspects, the gas flow rate is at least about 50 $cm^3$/min, about 75 $cm^3$/min, about 100 $cm^3$/min, about 125 cm³/min, about 150 cm³/min, about 175 cm³/min, about 200 cm³/min, about 225 cm³/min, about 250 cm³/min, about 275 cm³/min, about 300 cm³/min, about 350 cm³/min, about 400 cm³/min, about 500 cm³/min. In some embodiments the gas flow is the same throughout the entire process while in other embodiment the gas flow is different. In some embodiments, the gas flow rate is between 25 and 500 cm³/min with any range between these lower and upper values encompassed herein.

The length of time that the CVD process is carried out is predetermined based on the target characteristics of the deposited film. A longer time creates a thicker film while a shorter time creates a thinner film. In some aspects, the predetermined time is about 15 minutes, about 30 minutes, about 45 minutes, about 60 minutes, about 90 minutes, about 120 minutes, about 150 minutes, about 180 minutes, about 210 minutes, about 240 minutes, about 270 minutes, about 300 minutes, about 360 minutes, about 420 minutes, about 480 minutes, about 540 minutes, about 600 minutes, about 660 minutes, about 720 minutes, about 780 minutes, about 840 minutes, about 900 minutes. In some aspects, the predetermined time period is between about 15 and 900 minutes with any range between these lower and upper values also encompassed herein.

The temperature at which the CVD process is carried out is predetermined based on the target characteristics of the deposited film and the identity of the precursors. Different precursors will vaporize or sublime at different pressure and temperature combinations, and the predetermined temperature will be selected accordingly. In embodiments with more than one precursor, the predetermined temperature can be the same or different for each precursor. It can also be the same or different at the location of the substrate. By way of example and not limitation, in one embodiment using MAI and $BiI_a$ as precursors, the predetermined temperature is 199° C. for the MAI, 230° C. for the $BiI_a$, and 160° C. for the substrate. In general the temperature of the substrate will be lower than the temperature of either precursor so that the vapor more readily deposits. In some embodiment, the temperature and pressure at the substrate will be such that it is below the sublimation temperature and pressure of the one or more precursors.

In a CVD process using at least two precursors, the location of the precursors relative to each other and the substrate is one parameter that determines the properties of the final film. The location of the precursors and substrate will depend on multiple factors, including, but not limited to, the identity of the one or more precursors, the gas flow rate, the temperature profile of the furnace, and the predetermined time which the CVD process is carried out. These parameters will be selected so as to deposit the film on the substrate having the targeted characteristics.

The thickness of the deposited film is one factor that determines the characteristics of the film. The thickness will vary based on multiple parameters, including, but not limited to, the identity of the one or more precursors, the gas flow rate, the predetermined temperature, the predetermined time, the number of deposition cycles performed, and the type of substrate. In some embodiments, the thickness of the film is at least about 1 nm, about 5 nm, about 10 nm, about 25 nm, about 50 nm, about 100 nm, about 200 nm, about 300 nm, about 500 nm, about 775 nm, about 1000 nm, about 1250 nm, about 1500 nm, about 2000 nm. In some aspects, the thickness of the deposited film is between about 1 and 2000 nm with any range between these lower and upper values also encompassed herein.

In some embodiments, multiple deposition cycles are performed. The size of the crucible that holds the precursor(s) may be limited in some tube furnaces or other CVD apparatus, so a plurality of cycles may be performed. In some instances a second deposition is performed, and the precursors may be the same or different than those used in the previous cycle. Using multiple cycles, a multilayer film can be prepared on a substrate with each layer being the same or different than the previous layer. In some embodiments, there may be 2, 3, 4, 5, 6, 7, 8, 9, or 10 layers.

In some embodiments, a memory device is disclosed. This memory device exhibits extraordinary resistive switching behavior, including low SET voltage (0.15 V), high ON/OFF ratio (up to $10^5$), excellent endurability (1000 cycles), long-term retention property ($1.6 \times 10^4$ s), and high frequency operability (as high as $10^4$ Hz). The mechanism of resistive switching behavior is attributed to the migration of iodine vacancies ($V_I$), driven by an external electrical field. This is verified by the Energy-dispersive X-ray spectroscopy (EDX) result which clearly shows the movement of iodine ions (I—) with a concentration gradient. Furthermore, first-principles density functional theory (DFT) calculations confirm the low activation energy for the migration of $V_I$s, which also support the mechanism. This disclosure provides a way to build air-stable, lead-free and high-performance non-volatile memories.

Figures 17A, 17B:
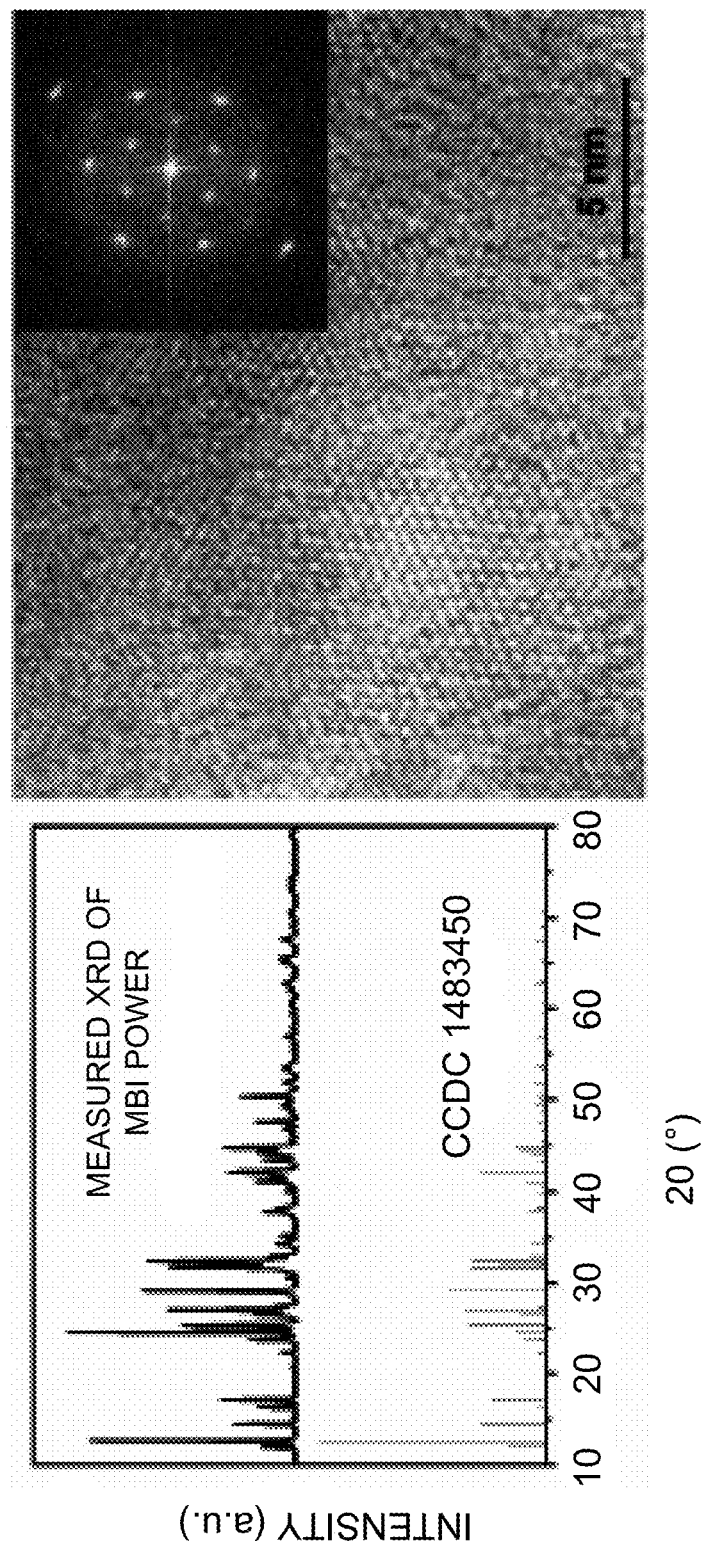
FIG. 17A is an exemplary embodiment of the characterization of MBI XRD patterns of as-prepared MBI powder and simulated single crystal data from CCDC 1483450 in accordance with the present disclosure.
FIG. 17B is an exemplary embodiment of a high-resolution TEM image and corresponding FFT pattern (inset) of an MBI sample in accordance with the present disclosure.

MBI samples were synthesized by reacting methylammonium iodide (MAI) with bismuth iodide ($BiI_3$) via a solution-based method. The crystal structure of MBI powder was determined by X-ray diffraction and shown in FIG. 17A. Experimentally obtained XRD pattern was in good agreement with crystallographic data of MBI belonging to the P63/mmc space group with a hexagonal crystal symmetry. The standard XRD data of MAI (JCPDS 10-0737) and $BiI_3$ (JCPDS 48-1795) were included to rule out of the presence of MAI or $BiI_3$ residue in MBI powder. Transmission electron microscopic (TEM) was employed to further investigate the morphology and crystal structure of MBI powder by directly attaching an MBI sample on a TEM grid. First, EDX mapping was carried out to analyze the elemental composition of MBI powder. The Bi, I, N, and C elements were clearly identified from EDX mapping pointing out a homogeneous elemental distribution in MBI powder. The high-resolution transmission electron microscopy (HRTEM) image (FIG. 17B) and corresponding fast Fourier transform (FFT) pattern (FIG. 17B inset) indicate a hexagonal crystalline structure with measured lattice distances of 7, 6.1, 3.6, 3.5, 3.3, 3.1, and 2.1 Å which can be respectively assigned to (101), (102), (006), (202), (203), (204), and (220) crystal planes. Those TEM results are consistent with the powder XRD data and further confirm the crystal structure of MBI powder.

Figure 17C:
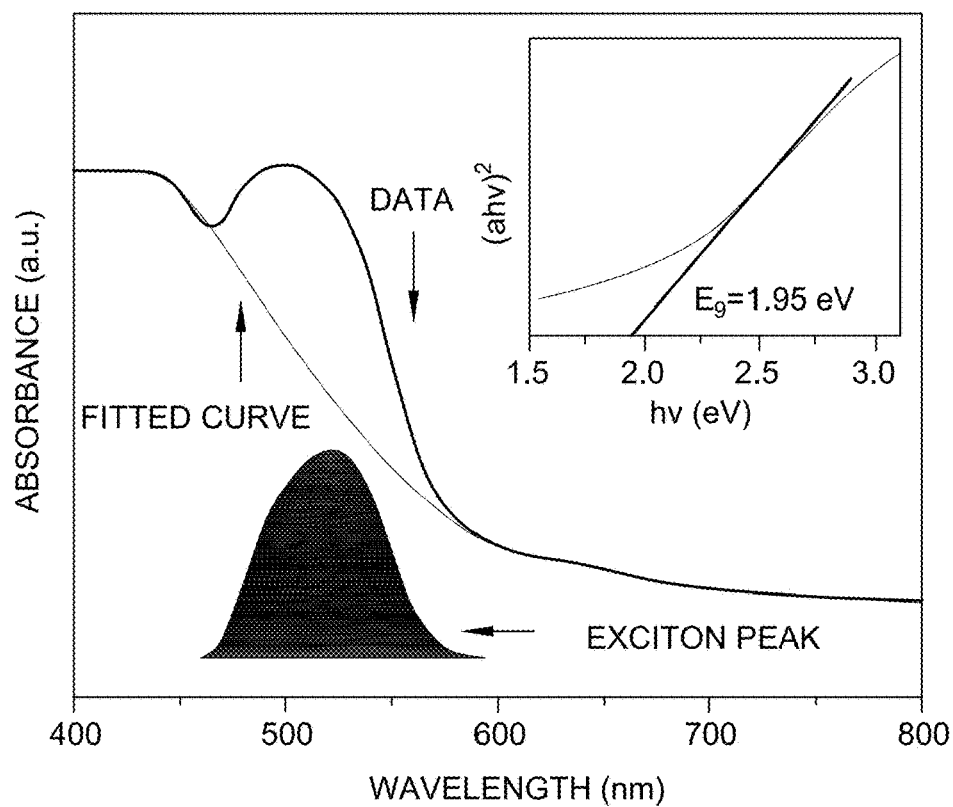
FIG. 17C is an exemplary embodiment of a UV-vis spectrum of MBI film, with a direct band gap of 1.95 eV in the inset in accordance with the present disclosure.

Subsequently, the ultraviolet-visible (UV-vis) absorption spectra was measured of MBI film deposited on indium tin oxide (ITO) coated glass substrate, and showed the result in FIG. 17C. The MBI film exhibits a broad absorption with an excitonic peak centered at 502 nm. The bandgap was calculated by Tauć plot extrapolation after subtracting the exciton peak from the absorption spectrum. As shown in FIG. 17C inset, the obtained direct band gap of MBI film is 1.95 eV, which is very close to the calculated direct band gap of 1.89 eV.

Figure 17D:
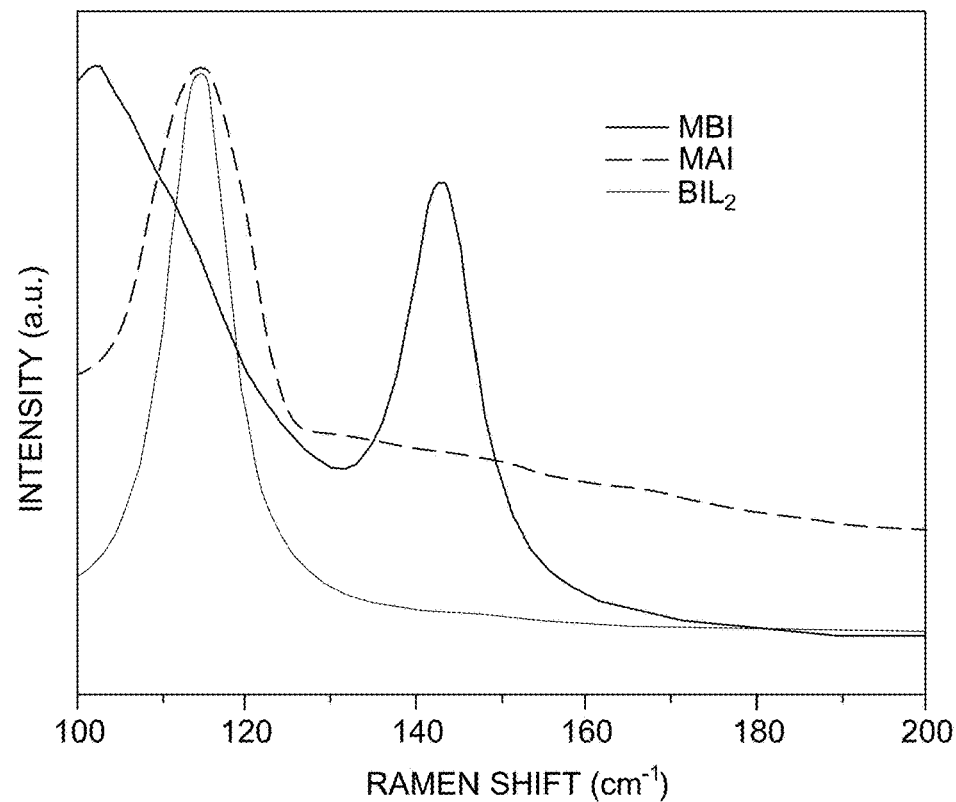
FIG. 17D is an exemplary embodiment of a Raman spectra of MBI, MAI, and $BiI_3$ film in accordance with the present disclosure.
Figure 17E:
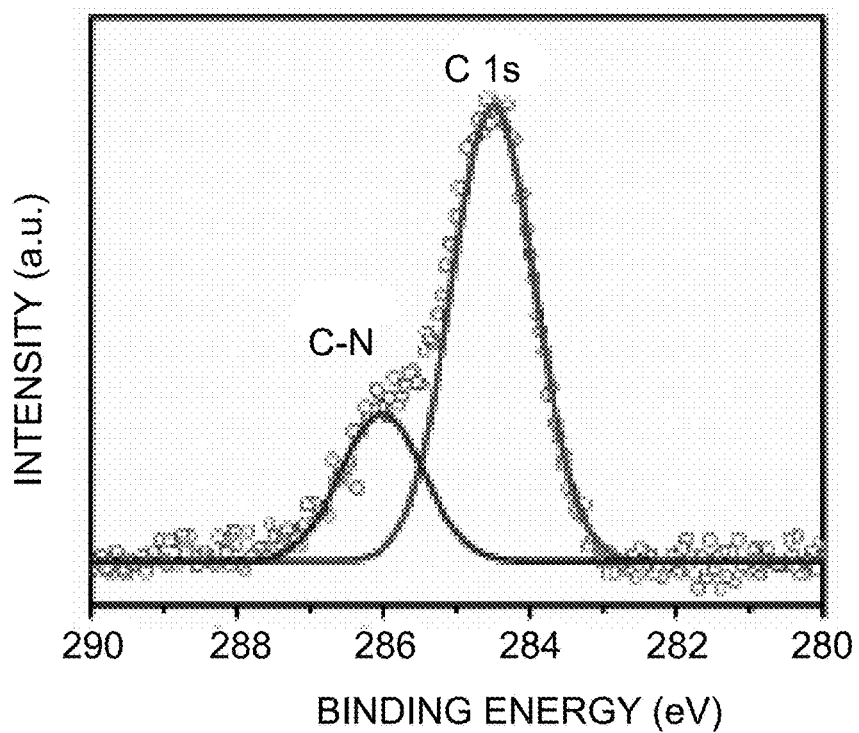
FIG. 17E is an exemplary embodiment of a high-resolution spectra of C is for MBI film in accordance with the present disclosure.
Figure 17F:
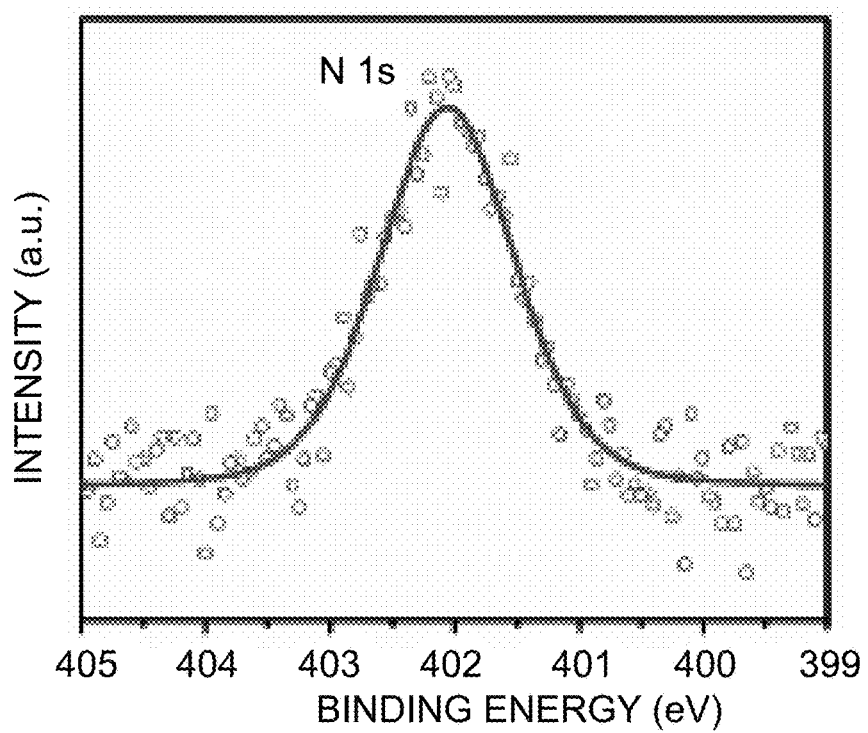
FIG. 17F is an exemplary embodiment of a high-resolution spectra of N is for MBI film in accordance with the present disclosure.
Figure 17G:
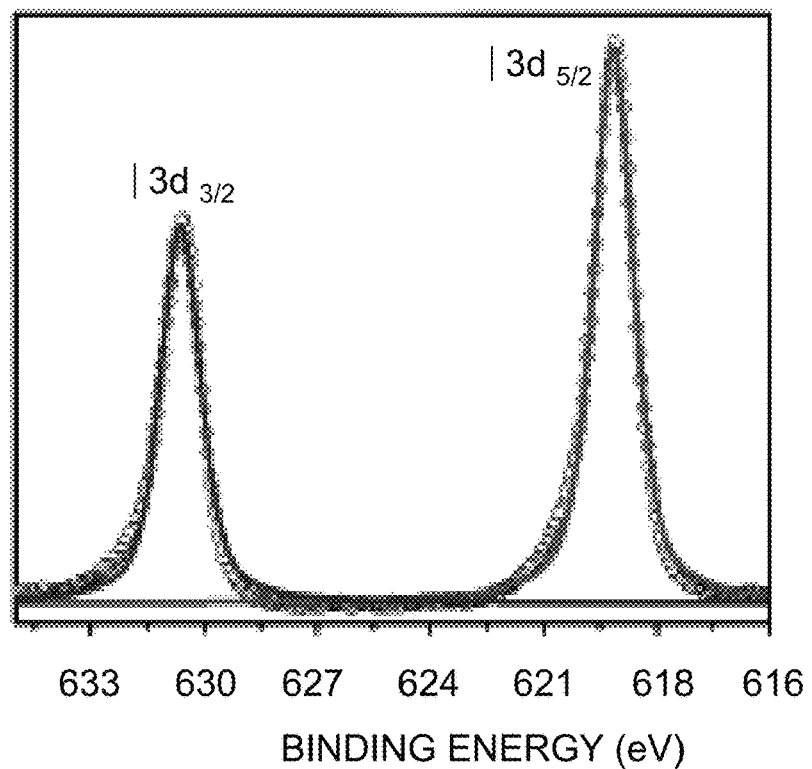
FIG. 17G is an exemplary embodiment of a high-resolution spectra of I 3d for MBI film in accordance with the present disclosure.
Figure 17H:
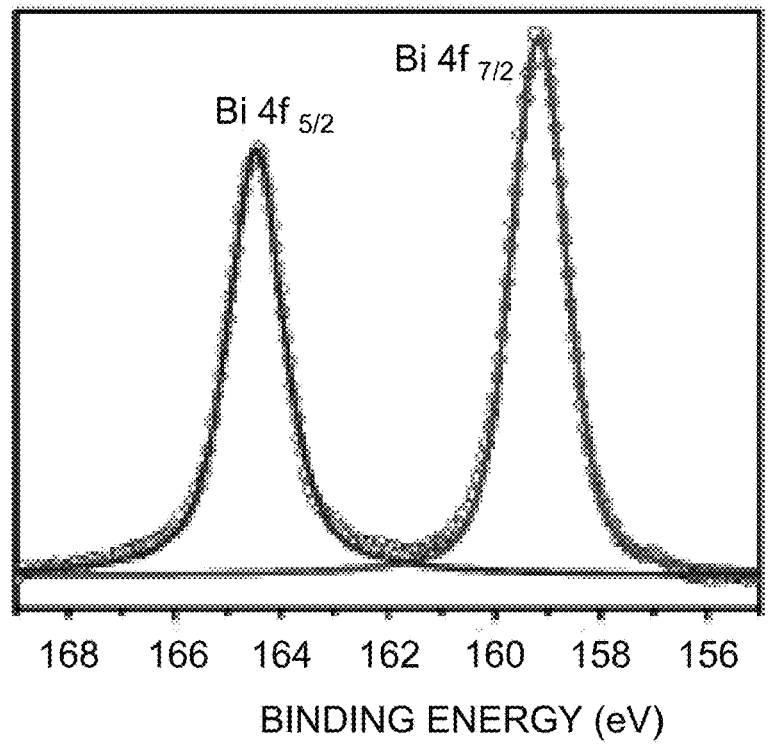
FIG. 17H is an exemplary embodiment of a high-resolution spectra of Bi 4f for MBI film in accordance with the present disclosure.

Furthermore, MBI, MAI, and $BiI_3$ films deposited on Si wafer were subjected to Raman spectroscopy analysis, the Raman spectra also clearly exclude the presence of MAI or $BiI_3$ residue in MBI sample (FIG. 17D). To unambiguously verify the elemental composition and valence of near-surface atoms, X-ray photoelectron spectroscopy (XPS) was performed on the MBI film. As shown in FIG. 17E, the primary peak located at 248.5 eV is attributed to the C—C bonds from adventitious carbon, while the nearby shoulder peak centered at 286 eV is assigned to the C—N bonds related to the methylammonium cation (MA$^+$). FIG. 17F displays the N is signal (402.05 eV) originating from the MA$^+$. The I 3d$_{3/2}$ (630.65 eV) and I 3d$_{5/2}$ (619.15 eV) peaks are associated with the characteristic signals from the I— species (FIG. 17G). The Bi 4f spectra can also be deconvoluted into two peaks, namely Bi 4f$_{5/2}$ (164.5 eV) and Bi 4f$_{7/2}$ (159.15 eV), corresponding to the presence of Bi$^{3+}$ species. Since the stability of semiconductor materials is critical for their commercial applications, the as-synthesized MBI samples were exposed to ambient air for 60 days under 30% relative humidity in dark condition to test their stability. The XRD pattern of MBI powder measured at the 60th day exhibits the same peak positions and a little intensity change in comparison with that of pristine MBI powder, demonstrating high stability of MBI powder. The UV-vis spectrum of MBI film almost doesn't change, which provides strong evidence for its high stability. Both of the results indicate the high stability of MBI samples.

Figures 18A, 18B:
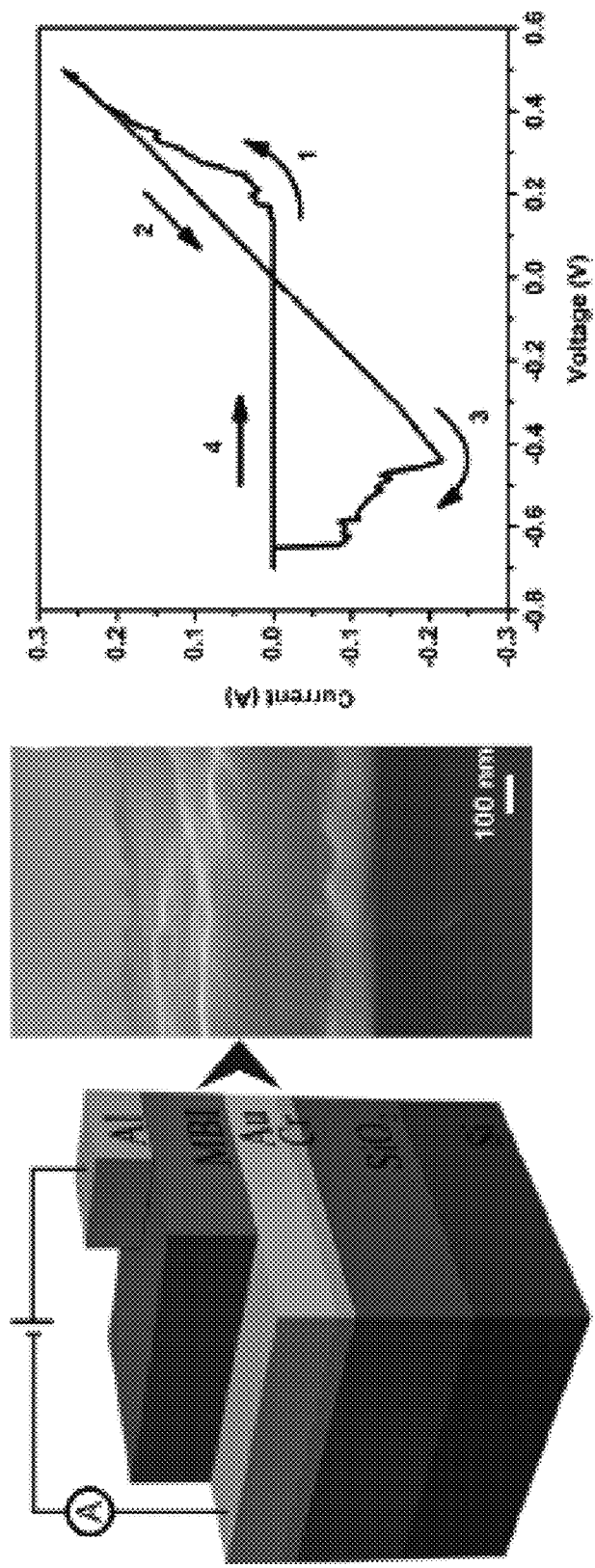
FIGS. 18A-18F depict exemplary embodiments of resistive switching properties of Al/MBI/Au devices in accordance with the present disclosure.

To investigate the feasibility of using MBI in a resistive switching memory, an MBI film was applied as an active layer in an Al/MBI/Au device. The device was fabricated by depositing MBI film (250 nm) on SiO$_2$ (300 nm)/Si substrate with pre-coated Au (100 nm)/Cr (5 nm) bottom electrodes, followed by sputtering 100 nm of Al top electrodes (squares with side of 50 μm) through a shadow mask. The schematic structure of a Al/MBI/Au device is shown in FIG. 18A, with a cross-sectional scanning electron microscopy (SEM) image presenting the side view of MBI film. The obtained Al/MBI/Au device was subjected to current-voltage (I-V) measurements under a dc voltage bias sweep (0 V→0.5 V→0 V→−0.7 V→0 V) to the top electrode (the bottom electrode was grounded) at 25° C. in dark condition. Initially, the current was quite small since the device was at high-resistance state (HRS, as known as OFF state).

Figure 18C:
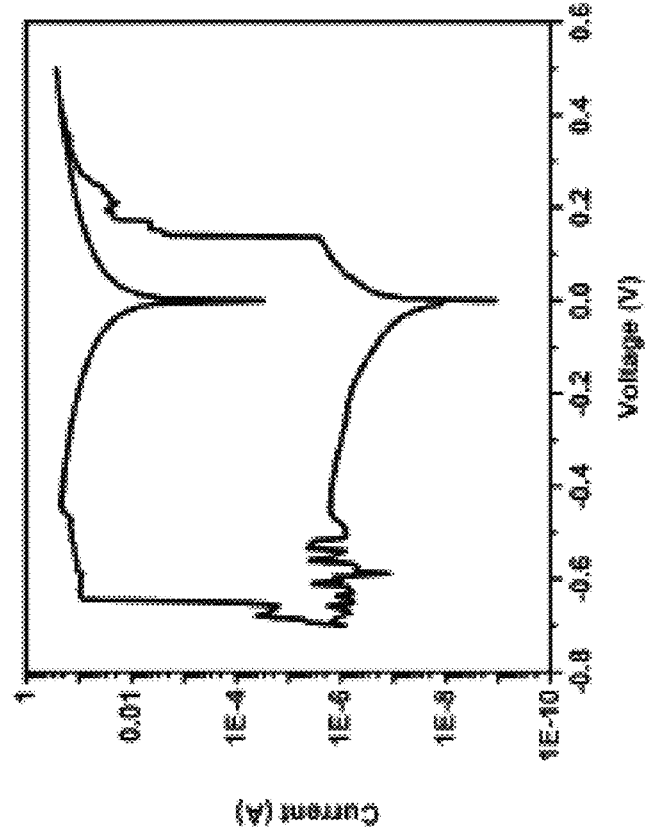

When scanning the positive bias voltage from 0 V to 0.5 V, the set process occurred at a relatively low voltage of 0.15 V, corresponding to an abrupt resistance change from HRS to low-resistance state (LRS, as known as ON state). During the reverse voltage bias sweep process (0.5V→−0.7 V), the device switched back to OFF state again at −0.63 V, implying the happen of RESET process (FIG. 18B). The alternation between ON state and OFF state along with the feature of a typical hysteresis loop demonstrates the formation of resistive switching behavior. The logarithmic scale shown in FIG. 18C depicts a high ON/OFF ratio up to 10$^5$. Although the resistance is slightly fluctuated at the OFF state, the ON/OFF ratio is maintained in the range of from about 10$^4$ to about 10$^5$.

Figure 18D:
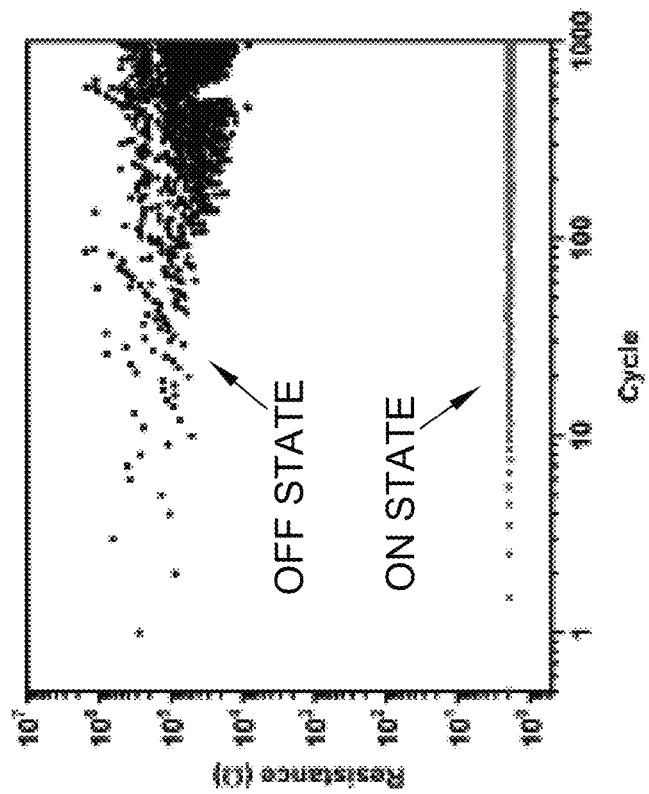
Figure 18F:
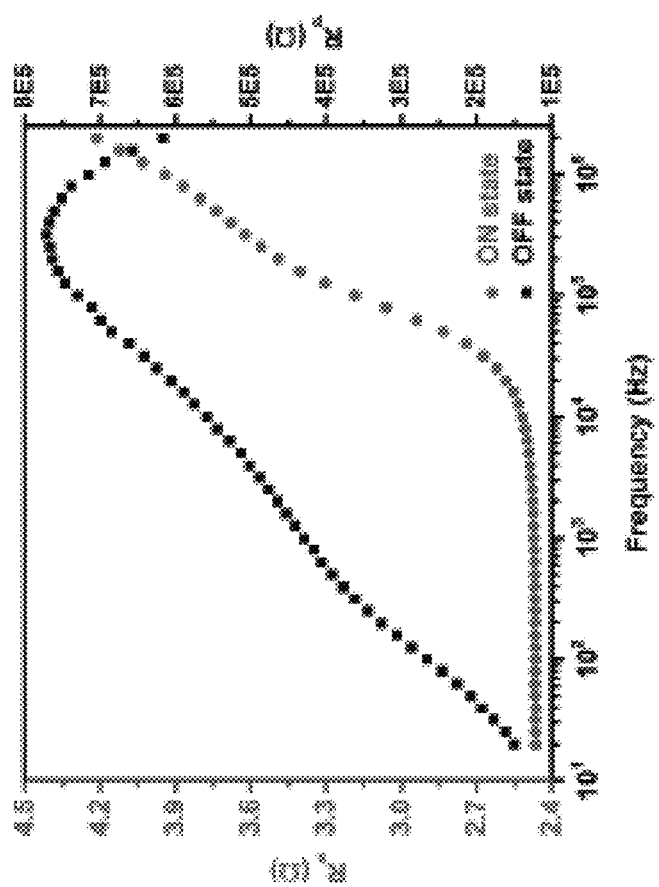
Figure 18E:
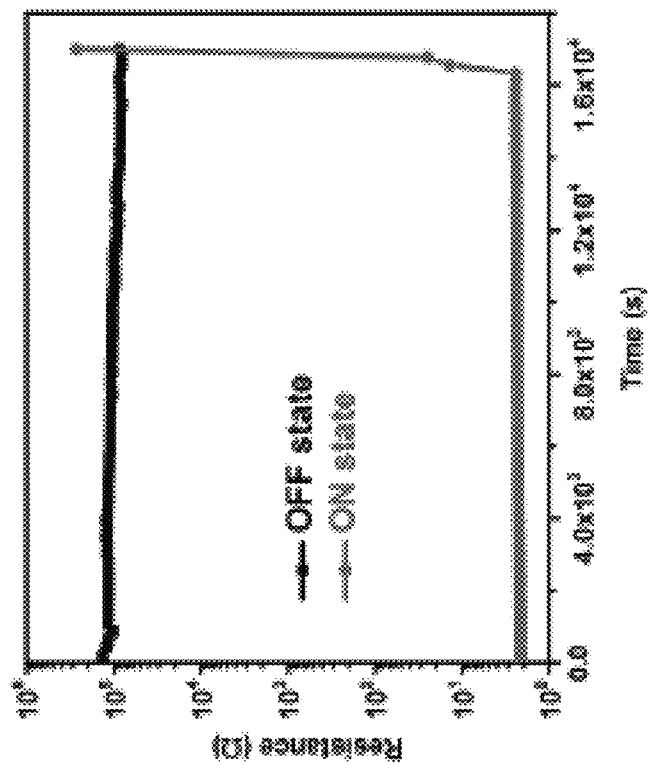

In addition to the ON/OFF ratio, the endurance is also an important factor for the practical application of nonvolatile memories. The inconsequential change during 1000 cycles of ON/OFF indicates that Al/MBI/Au device possesses excellent endurability (FIG. 18D). Furthermore, the room-temperature retention measurement was performed with a read bias of 0.05 V in dark condition to evaluate the nonvolatile property. The resistances of both OFF state and ON state remain stable for 1.6×10$^4$ s, suggesting the reliable nonvolatile memristive behavior of Al/MBI/Au device (FIG. 18E). Moreover, to appraise the commercial workability of a Al/MBI/Au device for resistive switching memories, the resistance response of frequency from 20 Hz to 2 MHz was tested by an LCR meter at OFF state and ON state (FIG. 18F). Equivalent parallel resistance ($R_p$) and equivalent series resistance ($R_s$) are measured to represent OFF state and ON state using corresponding models. $R_p$ was found to first increase with increased frequency until 3×10$^5$ Hz due to space-charge effect, and then decrease at higher frequency resulting from the introduction of capacitor property. $R_s$ almost didn't change before frequency reached 10$^4$ Hz and rose thereafter owing to freeze out of ions at high frequency. The result of ON/OFF ratio over frequency was dominated in a certain range (5×10$^4$~2.5×10$^5$). Regardless, the device delivers reliable resistances under 10$^4$ Hz, verifying its high-frequency operability.

MBI material contains rich, intrinsic and shallow point defects such as vacancies and interstitials, thus, accumulation of such charged point defects can cause the resistance decrease in related regions. Among all these point defects, V$_I$ and iodine interstitial (I$_i$) are regarded as thermodynamically stable and highly mobile species with low activation energies. Consequently, it is proposed that the migration of V$_I$s or I$_i$s, which is driven by the external electrical field, results in the formation (or rupture) of conductive filament, generating resistive switching behavior.

Figure 19A:
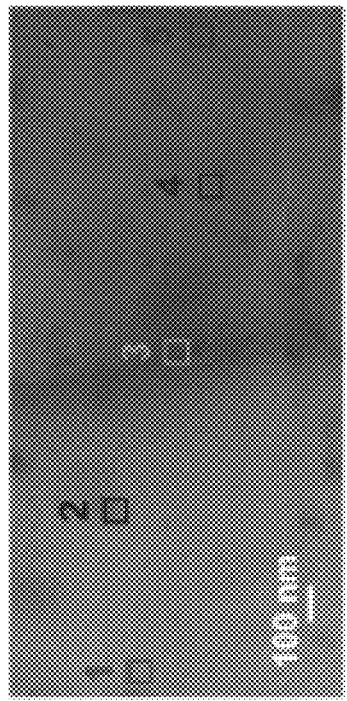
FIG. 19A is an exemplary embodiment of a schematic structure of an Al/MBI/Al planar device prepared for EDX characterization in accordance with the present disclosure.
Figure 19B:
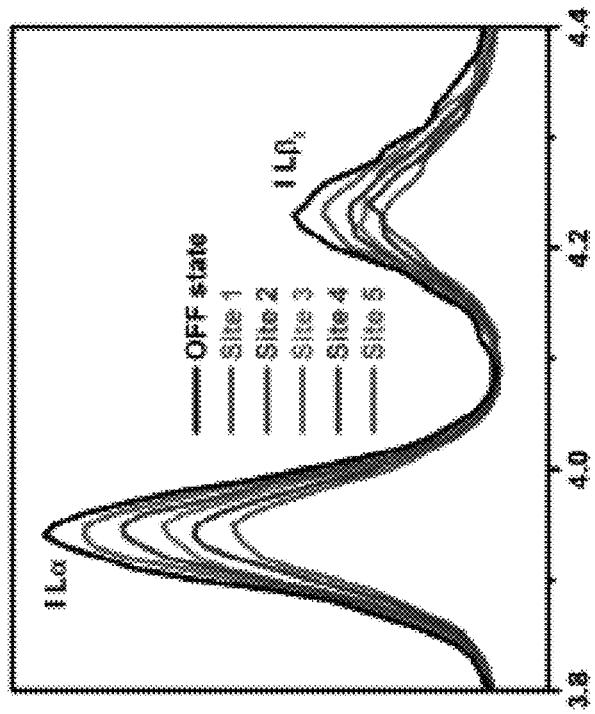
FIG. 19B is an exemplary embodiment of an SEM image of an MBI film between two Al electrodes in the planar device with five sites for EDX analysis in accordance with the present disclosure.
Figure 19C:
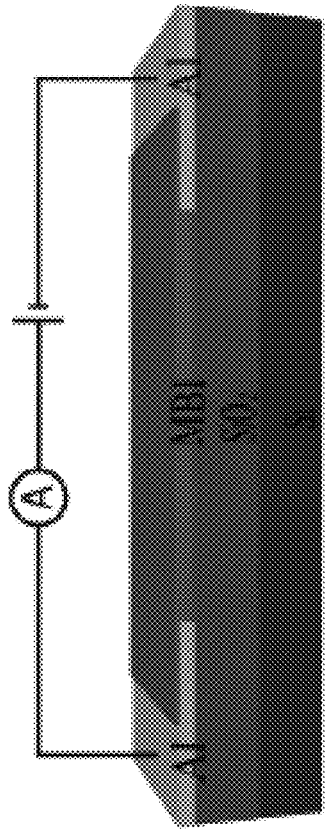
FIG. 19C is an exemplary embodiment of a normalized EDX spectra of Bi (M series) and I (L series) collected around the five sites at ON state, in comparison with the spectrum at OFF state in accordance with the present disclosure.

To verify the proposed hypothesis, EDX measurements were performed to analyze the elemental distribution in an MBI film at OFF state and ON state. A planar Al/MBI/Al device was fabricated on SiO$_2$/Si wafer by photolithography, sputter deposition, liftoff process, and spin-coating method (FIG. 19A). The gap between two Al electrodes before depositing MBI film was evident. FIG. 19B shows the SEM image focusing on the MBI film between two Al electrodes in the planar device with five randomly selected positions for EDX analysis. The elemental distributions in the as-fabricated MBI film around different sites were first collected to evaluate the I/Bi atomic ratio at OFF state (FIG. 19C). After switching the device to ON state, the elemental distributions collected from those sites were measured again and shown as normalized data against the intensity of Bi M series peaks in FIG. 19C. The main characteristic X-ray peaks in EDX spectra for Bi and I are as follows: Bi (Mα: 2.43 keV and Mβ: 2.52 keV) and I (Lα: 3.95 keV, Lβ$_1$: 4.23 keV, Lβ$_2$: 4.51 keV, and Lγ$_1$: 4.81 keV).

Figure 19D:
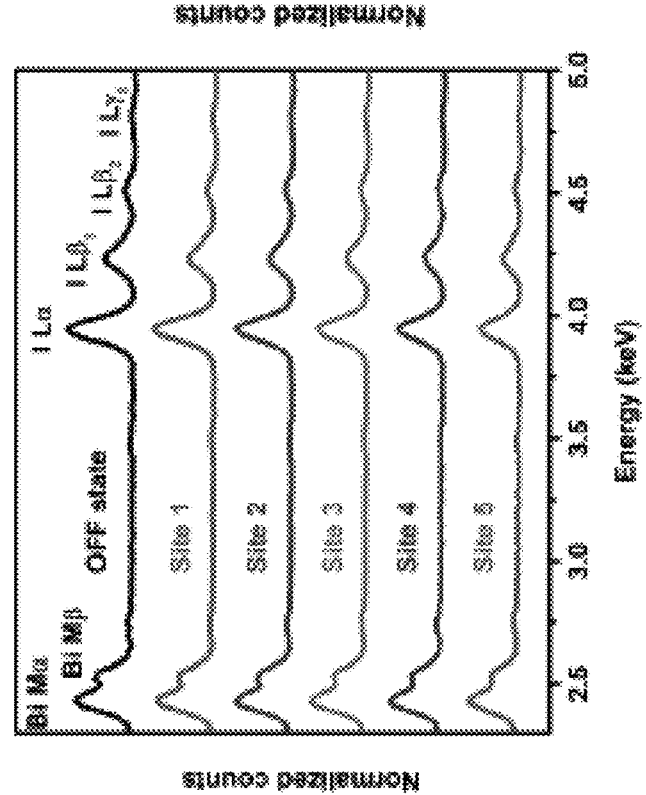
FIG. 19D is an exemplary embodiment of a normalized EDX spectra of I Lα and I Lβ1 against the intensity of Pb M series peaks in accordance with the present disclosure.

To clearly clarify the difference among these spectra, an enlarged image of normalized I Lα and I Lβ$_1$ spectra is shown in FIG. 19D. Both I Lα and I Lβ$_1$ peaks become smaller along the electric field direction from site 1 to site 5. FIG. 19E shows the quantitative results of average I/Bi ratio around different sites at ON state as well as OFF state. The average I/Bi ratio at OFF state was close to 4.5, indicating accurate stoichiometry of MBI film; whereas at ON state, the average I/Bi ratio decreased gradually from 4 (site 1), 3.5 (site 2), 3 (site 3), 2.6 (site 4), to 2.4 (site 5). These results confirm that the average I/Bi ratio is always reduced along the electric field direction after switching to ON state. Small-scale error bars, which represent standard deviations of I/Bi ratio, demonstrate the uniform chemical composition inside MBI film (FIG. 19E). Additionally, the decrease of I/Bi ratio (significantly below the stoichiometry value of 4.5) throughout tested MBI film reveals that the point defects involved in resistive switching process should be V$_I$s rather than I$_i$s.

Since MBI structure is a derivative of the ABX$_3$ perovskite, which is composed of layers of face-shared BiI$_6$ octahedra, V$_I$s can move easily along an octahedral edge. Based on this and the previous results, the underlying mechanism is interpreted as follows. After applying a positive bias voltage on the anode, the I— ions are attracted to the anode and potentially accumulated around the anode.

The Al anode reacts with accumulated I— ions to form $AlI_x$, which reduces the backward diffusion of I— ions. In the meantime, $V_I$s are formed inside MBI film with the highest concentration (lowest I/Bi ratio) near the cathode. As the positive bias increases, $V_I$-rich regions will expand toward the anode, and a conduction channel between two electrodes is eventually created (FIG. 19F). In contrast, during the RESET process, I— ions are produced from $AlI_x$ via a reversible reaction and then migrate into MBI film, causing the rupture of conductive channel.

Figure 20B:
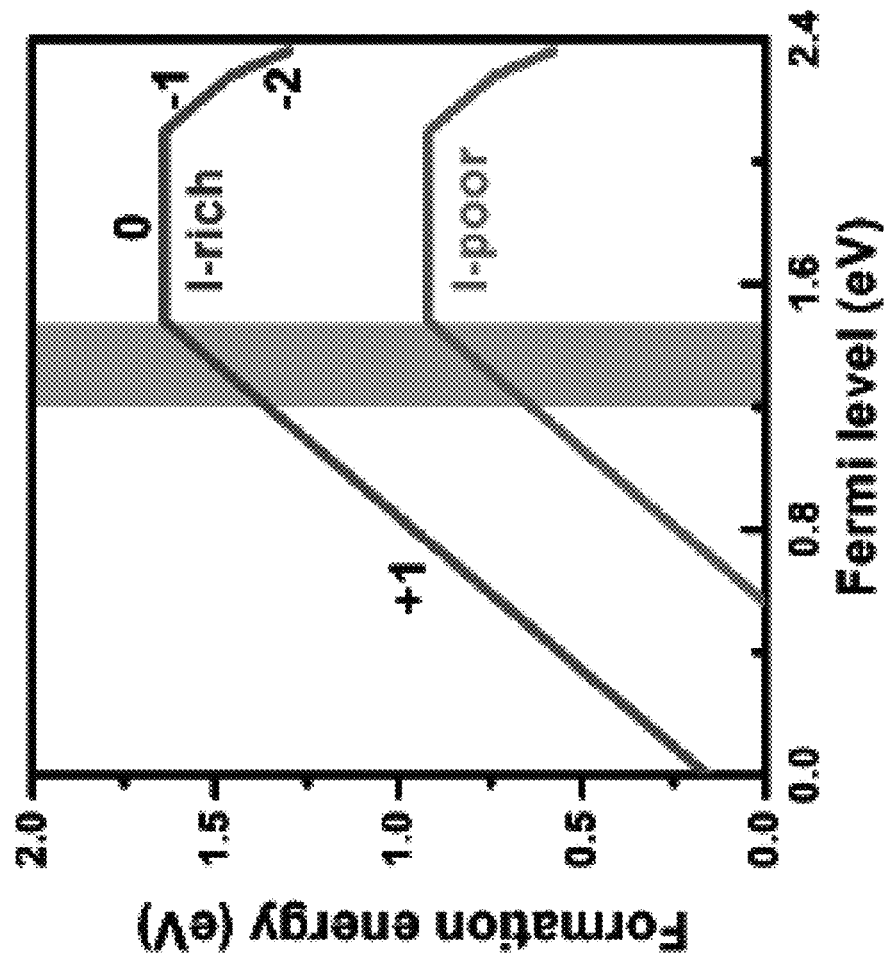
FIG. 20B is an exemplary embodiment of the formation energy of $V_I$ as a functional of Fermi level relative to valance band maximum in MBI crystal at I-rich and I-poor conditions in accordance with the present disclosure. The value beside each segment indicates the charge state of $V_I$ and the shaded area denotes $V_I^+$ in the n-type doping region.
Figure 20A:
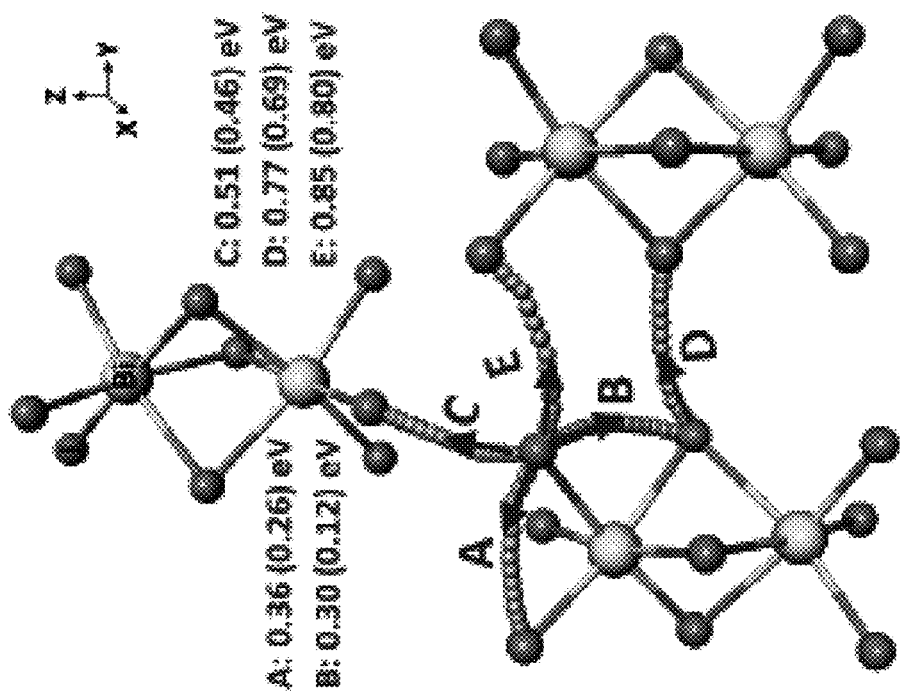
FIG. 20A is an exemplary embodiment of five hopping paths A-E of $V_I^+$ in an MBI crystal in accordance with the present disclosure. The forward hopping of each path is indicated by an arrow and the corresponding activation barrier is also labeled. The backward barrier is included in parenthesis. The minor differences between the forward and backward barriers are majorly induced by the asymmetry introduced by MA molecules.

To investigate if iodine vacancy ($V_I^+$) can migrate and induce the change of electrical conductivity, DFT calculations were carried out to examine the hopping barriers of $V_I^+$. Since $MA_3Bi_2I_9$ can be considered as $Bi_2I_9$ clusters surrounded by MA molecules, the hopping paths of $V_I^+$ fall into two categories: (1) those within one $Bi_2I_9$ cluster or intracluster hoppings and; (2) those between two $Bi_2I_9$ clusters or intercluster hoppings. FIG. 20A summarizes all the examined paths and the corresponding activation barriers. The activation barriers of intracluster hoppings are relatively small, in the range of 0.12-0.36 eV (paths A and B). The activation barriers of intercluster hoppings are anisotropic: 0.69-0.85 eV in the X-Y plane (paths D and E) and 0.46-0.51 eV in the Z direction (path C). Therefore, the rate-limiting hopping barrier of $V_I^+$ is 0.46-0.51 eV. Such hopping barrier is intermediate among the ionic hopping barriers of typical memristive materials. For instance, $V_O^{+2}$ hopping barrier is 0.1 eV in $HfO_2$, 0.3 eV in anatase $TiO_2$, 0.5 eV in monoclinic $VO_2$, and 0.7 eV in rutile $TiO_2$.

Two items are of particular importance. First, the rate-limiting hopping barriers of 0.46-0.51 eV correspond to that in a perfect $MA_3Bi_2I_9$ crystal. Because the experimental samples are polycrystals with abundant grain boundaries, they exhibit activation barriers less than those within a perfect crystal. Hence, the rate-limiting barrier obtained here should be considered as an upper limit. Second, the migration barrier measured in experiments depends on not only the hopping barrier of $V_I^+$ but also its formation energy (or concentration). The defect formation energy calculations show that the formation energy of $V_I^+$ in n-type samples varies in the range of 0.64-1.64 eV depending on the chemical potential of iodine and the position of the Fermi level (FIG. 20B). Because of such large uncertainty, it is necessary to identify the accurate growth conditions to obtain an accurate formation energy of $V_I^+$ and consequently its migration barrier.

The examples presented herein are meant to represent certain embodiments of the disclosure and are not intended to be limiting in any way. Other embodiment as described elsewhere and understood by a person having skill in the art are also encompassed herein.

EXAMPLES

Preparation of Methylammonium Iodide (MAI)

25 mL of methylamine (33 wt % in ethanol) was added to a 250 mL, three-neck flask at a temperature below 7° C. 10 mL of hydroiodic acid (HI, 57 wt % in water) was added to the MAI solution while stirring. The MAI precipitate was recovered under reduced pressure and a water bath temperature below 50° C.

Figure 9:
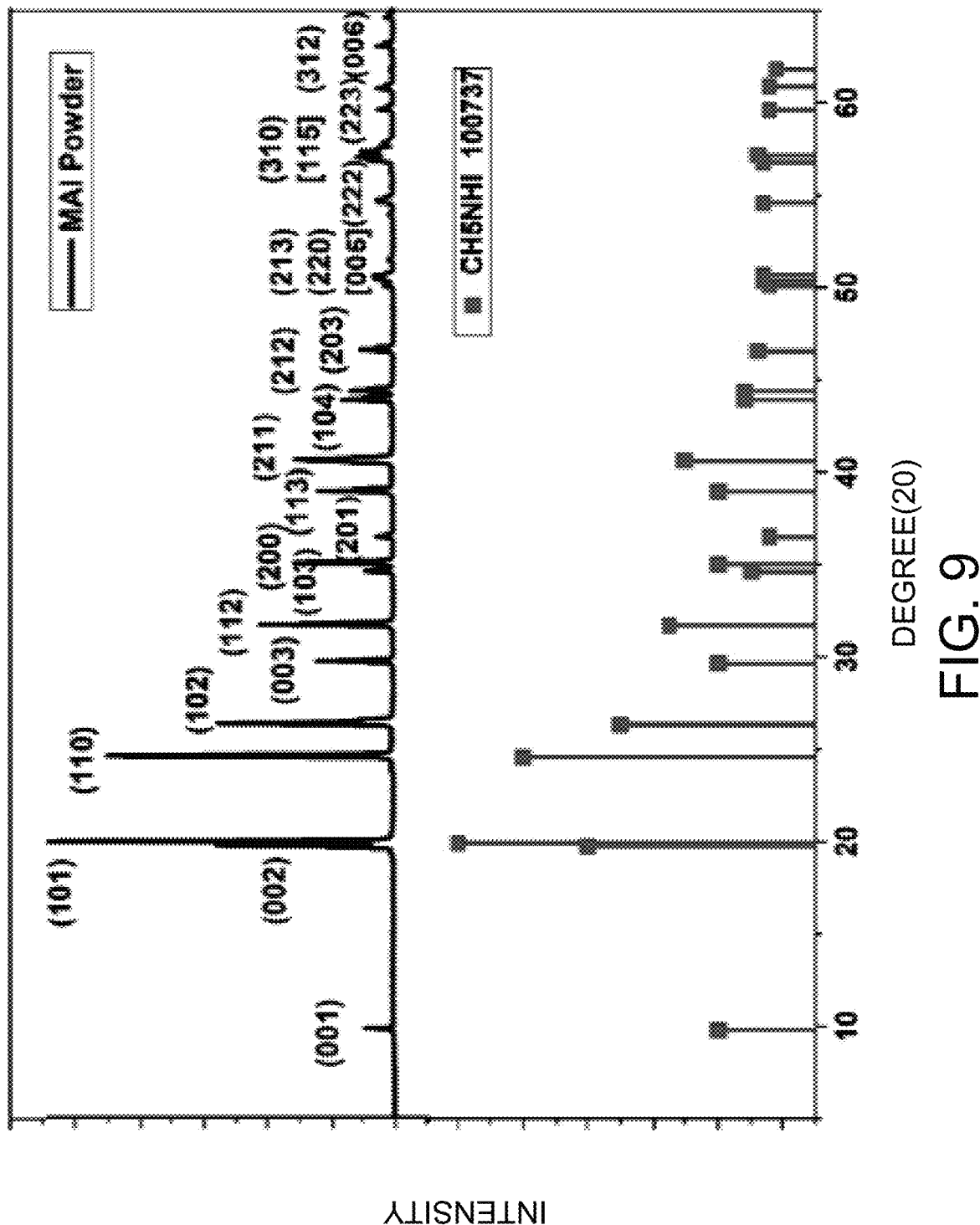
FIG. 9 is an exemplary embodiment of the XRD spectra of MAI powder in accordance with the present disclosure.

The MAI was recrystallized three times in absolute ethanol and diethyl ether. A white powder was obtained and dried at 60° C. overnight under vacuum. The phase purity of the compound was confirmed by a powder X-ray diffractometer (FIG. 9).

Perovskite Synthesis Via APCVD

The MAI prepared above was used as a first precursor for the APCVD, and $BiI_3$ (99%) was used as a second precursor. A quartz tube mounted on a single zone furnace was used for the APCVD studies. Silicon wafers (Test Grade) with or without a 100 nm thermal oxide layer, glass slides, pre-cut 5 mm×5 mm high purity quartz substrates and 2 cm×2 cm WILLOW® flexible glass from Corning were used as substrates. The silicon and glass substrates were cut to approximately 1 cm×2 cm size, ultrasonically cleaned in DI water, acetone (99.9%) and ethanol (99.9%) mixture for 10 minutes, washed with IPA and DI water, dried in compressed air, cleaned in UV Ozone for 10 minutes, and placed in the quartz tube, 23 cm away from the upstream end.

The schematic of the experimental set-up is shown in FIG. 1A, while a picture of the furnace after successful $MA_3Bi_2I_9$ deposition is shown in FIG. 1B. The deposition is marked by the characteristic orange color of the $MA_3Bi_2I_9$ film on the downstream side. Initially, 50 mg of MAI was the first precursor and 60 mg of $BiI_3$ was the second precursor and placed at 2.5 cm and 13 cm from the upstream end of the quartz tube in alumina boat crucibles. First, the quartz tube was purged with 280 cm³/min flow of UHP Ar for 10 minutes. The temperature in the quartz tube was then raised at the rate of 1.8° C./minute until the temperature at the center of the tube reached 230° C. The furnace was maintained at this temperature for various times of 15, 30, 45, 60, 90, 180, 240, 360 and 480 minutes of deposition. After deposition, the furnace was naturally allowed to cool to ambient temperature.

One aspect of the APCVD process lies in the placement of the MAI and $BiI_3$ sources along the length of the quartz furnace reactor. This permits cosublimation of both sources together. FIG. 1C shows the temperature profile of the furnace along the length of the CVD quartz tube. This calibration measurement was done prior to the deposition by sliding a thermocouple probe inserted inside the quartz tube with Ar flowing at the rate of 280 cm³/min. The temperature varies from 199° C. from the upstream end (labeled as 2.5 cm on the x-axis) and peaks to the desired temperature set-point of the furnace (230° C.) at the center of the tube (13 cm from the upstream end). The temperature then drops off on the downstream side to 160° C., 23 cm from the upstream end.

The variability of the temperature along the length of the quartz furnace reactor is used in the APCVD process. The MAI boat is placed at 2.5 cm from the upstream side where the temperature is 199° C. which allows the MAI to sublimate. The $BiI_3$ is kept in the middle of the quartz reactor where the temperature is 230° C. Thus, the Ar flow causes the simultaneous transport of MAI and $BiI_3$ vapor to the cooler zone in the downstream region. Deposition and reaction of the MAI and $BiI_3$ vapors take place to produce the $MA_3Bi_2I_9$ film at around 23 cm from the upstream side, where the temperature is maintained at 160° C.

Thermogravimetric measurements were used to calculate vapor pressure of the MAI and $BiI_3$. The enthalpy of sublimation is 105±5 kJ/mol for MAI and 128±2 kJ/mol for $BiI_3$. The sublimation temperatures for MAI and $BiI_3$ are 247±26° C. and 316±2° C. (see Table 5). Based on this analysis, the partial pressures of MAI and $BiI_3$ at the points of sublimation and deposition was calculated. The vapor pressure as a function of temperature is provided in Table 1. At the points of sublimation (199° C. for MAI and 230° C. for $BiI_3$), the partial pressure of MAI is higher than $BiI_3$ by 4.7×. As the vapor moves downstream, the temperature drops and at 160° C. (i.e., the deposition temperature), the MAI vapor pressure is 87× higher than $BiI_3$. This implies that the BiI$_3$ should readily condense on the substrate, nucleate and grow. On the other hand, MAI deposition followed by a solid-state reaction with BiI$_3$ to form MA$_3$Bi$_2$I$_9$ may be a kinetically rate determining step for MA$_3$Bi$_2$I$_9$ film formation.

Calculation of Vapor Pressure for BiI$_3$ and the Ratio of MAI to BiI$_3$

Thermogravimetric analysis (TGA) was used to determine the mass loss behavior of the MAI and BiI$_3$ powders. TGA was performed using Q5000 IR (TA Instruments), heating at a steady heating rate (typically between 2.5 and 10° C./min) under a constant 20 mL/min of N$_2$ gas. The investigated temperature intervals were between 25° C. and 800° C. Ceramic crucibles and approximately 5-15 mg of sample material was employed for each measurement. The approach presented here is adapted from previous studies, and the data for MAI is directly obtained from their analysis. The data for BiI$_3$ is obtained as described herein.

The Clausius-Clapeyron relation relates the vapor pressure p and the temperature T of a solid with its enthalpy of sublimation $\Delta H_{sub}$, where R is the gas constant (8.314 J/mol·K) according to $$\frac{d \ln(p)}{dt} = \frac{\Delta H_{sub}}{RT^2} \quad \text{Equation S1}$$

The first derivative of the TGA heat curve gives a direct measure of the instantaneous rate of mass loss $m_{sub}$ at temperature T, $$\frac{dm}{dt} = \frac{\Delta m}{\Delta t} = m_{sub} \quad \text{Equation S2}$$

At equilibrium, the rates of vapor deposition and evaporation are assumed to be equal. Hence the rate of mass loss by sublimation $m_{sub}$ can be related to the vapor pressure by Equation S3 according to Langmuir where A is the exposed sublimation surface area (calculated from the TGA sample pan during the measurement) and $M_w$ is the molecular mass of the material.

$$p = \frac{1}{A}\left(\frac{2\pi RT}{M_W}\right)^{1/2} m_{sub} \quad \text{Equation S3}$$

Integrating equation 51 yields equation S4, which allows the determination of $\Delta H_{sub}$, and sublimation temperature $T_{sub}$ from the slope and x-intercept of the plot of ln p vs. 1/T, respectively:

ln $$p = -\frac{\Delta H_{sub}}{R}\left(\frac{1}{T} - \frac{1}{T_{sub}}\right) \quad \text{Equation S4}$$

Figure 10B:
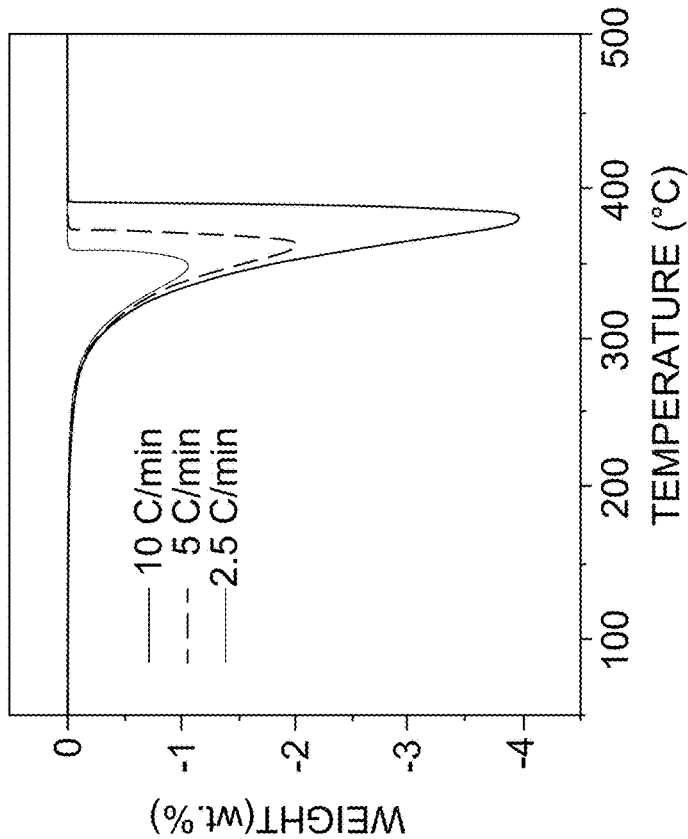
FIG. 10B is an exemplary embodiment of the $1^{st}$ derivative of the curve in FIG. 10A in accordance with the present disclosure.
Figure 10A:
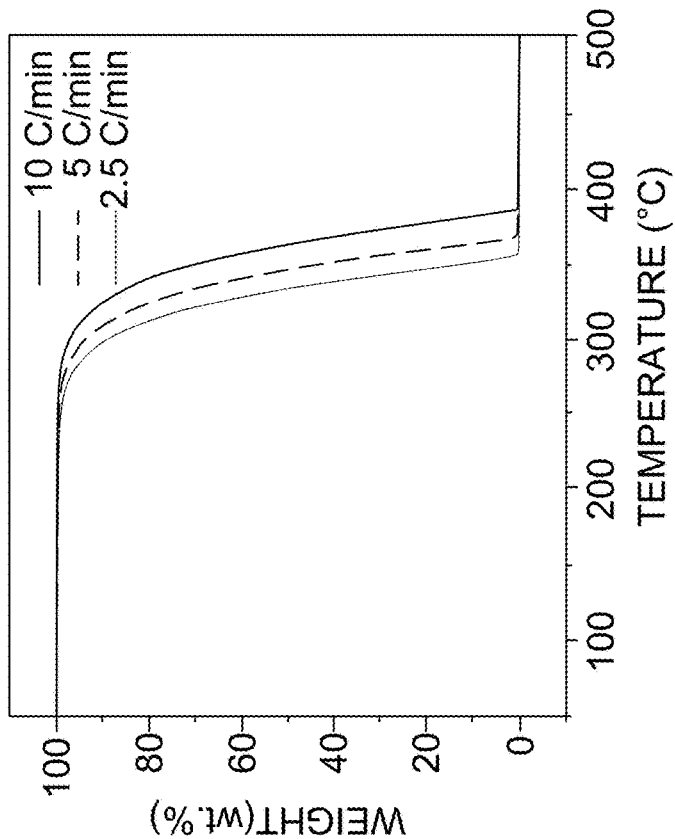
FIG. 10A is an exemplary embodiment of the TGA heating curve for the BiI$_3$ precursor in accordance with the present disclosure.
Figure 10D:
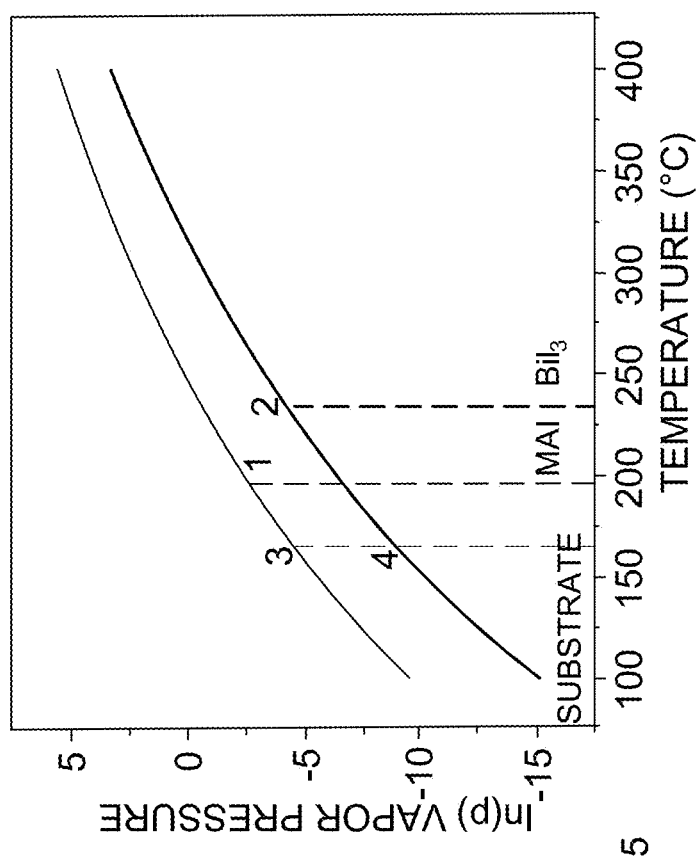
FIG. 10D is an exemplary embodiment of the vapor pressure of BiI$_3$ and MAI as a function of temperature in accordance with the present disclosure.
Figure 10C:
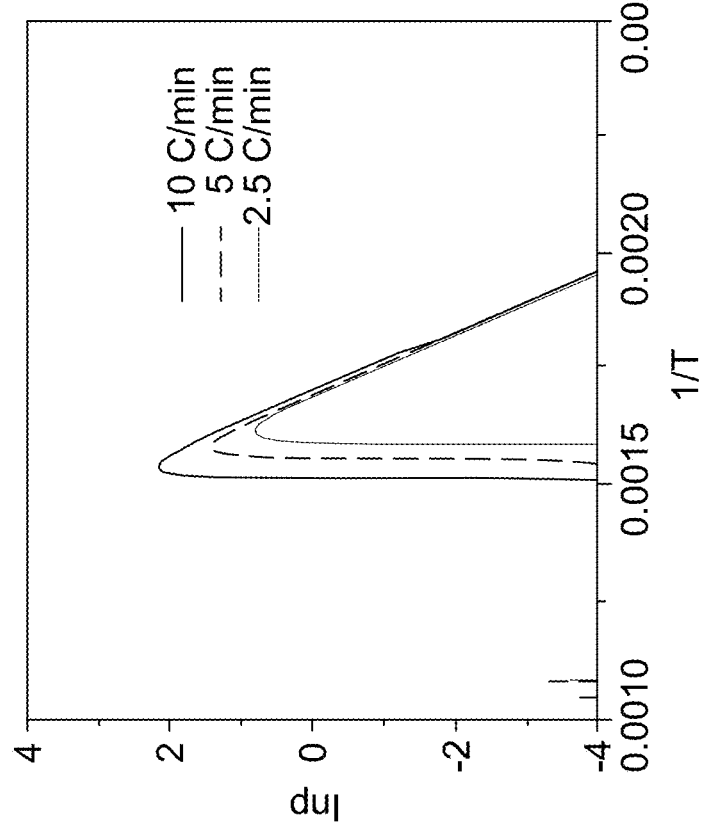
FIG. 10C is an exemplary embodiment of the calculated ln p vs 1/t graph of BiI$_3$ precursor in accordance with the present disclosure.

Based on this approach, FIG. 10A shows the weight loss of BiI$_3$ powder as a function of heating rate. The corresponding rate of weight loss (dm/dt) is shown in FIG. 10B. Therefore, using equation S3, it is possible to calculate p, the vapor pressure for BiI$_3$. This is plotted as a semi-log plot as a function of 1/T in FIG. 10C. As a result, the vapor pressure of BiI$_3$ is calculated from equation S4. This is shown in FIG. 10D. As stated previously, the vapor pressure of MAI is obtained. Using the known temperature profile of the furnace, it is possible to calculate the partial vapor pressures of MAI and BiI$_3$ at the point of sublimation and at the point of deposition (i.e. at the substrate).

It can be seen that the MAI vapor pressure is 4.7× of vapor pressure of BiI$_3$ as both the precursors sublimate inside the furnace, but at different temperatures (199° C. for MAI and 230° C. for BiI$_3$). When the molecules travel downstream to the cooler zone, deposition occurs. At the point of deposition, the temperature on the substrate=160° C. MAI remains more volatile and the ratio of the equilibrium vapor pressure of MAI:BiI$_3$=87. Further, the driving force for deposition is proportional to ln ($p_{sublimation}/p_{deposition}$) which for MAI=2.01 and for BiI$_3$=4.93. This implies that, compared to MAI, BiI$_3$ readily deposits on the substrate whereas, MAI infiltrates the BiI$_3$ crystals via gas phase adsorption, followed by a solid-state reaction to form MA$_3$Bi$_2$I$_9$. This is in line with the observations via SEM, XRD and XPS.

TABLE 1

Partial Pressures from the Thermogravimetric Analysis

| Precursor compound | Process | Temp (° C.) | Partial Pressure | MAI:BiI$_3$ ratio Sublimation | Deposition |
|---|---|---|---|---|---|
| MAI | Sublimation | 199 | 0.0846 | 4.7:1 | |
| BiI$_3$ | Sublimation | 230 | 0.0180 | | |
| MAI | Deposition | 160 | 0.01133 | | 87:1 |
| BiI$_3$ | Deposition | 160 | 0.00013 | | |

TABLE 5

The Enthalpy of Sublimation and Sublimation Temperatures

| Precursor | $\Delta H_{sub}$ | $T_{sub}$ |
|---|---|---|
| BiI$_3$ | 128 ± 2 | 316 ± 2 |
| MAI | 105 ± 5 | 247 ± 26 |

Film Characterization

Film morphology was characterized by Field Emission SEM under an accelerating voltage of 10 kV. X-ray diffraction (2θ scans) of deposited MA$_3$Bi$_2$I$_9$ films were obtained by X-ray diffractometer using the Cu Kα X-ray source (λ=1.5405 Å) within a diffraction angle (2θ) from 5° to 60°. X-ray photoelectron spectroscopy (XPS) was measured with a photon energy of 1486.6 eV (Al Kα). Optical transmittance of the MA$_3$Bi$_2$I$_9$ films on glass substrates was determined by UV-vis spectrometry.

The electrochemical analysis was performed with a standard three-electrode cell using the cyclic voltammetry (CV) mode in a Biologic potentiostat with a scan rate of 20 mV/s. A glassy carbon electrode was used as the working electrode to measure the formal potential of ferrocene/ferrocenium (Fc/Fc$^+$), whereas the Pt foil acted as the counter electrode. Silver (Ag) wire in 0.01 M AgNO$_3$+0.1 M tetrabutylammonium hexafluorophosphate (TBAPF$_6$) (98%) in acetonitrile (99.9%) was used as the reference electrode. The conduction band (CB) energy was calculated from the onset of reduction potential (Ey$_{ed}$) values, assuming the energy level of Fc/Fc$^+$ to be −4.8 eV below the vacuum level. The formal potential of Fc/Fc$^+$ was measured to be 0.075 V against a Ag/Ag$^+$ reference electrode in an electrolyte consisting of 0.001 M ferrocene in 15 mL of 0.1 M TBAPF$_6$ in acetonitrile solution. Therefore, from equation (1)

$$E_{CB}(E_{LUMO}) = -(E_{red} + 4.72\ 5)\text{eV} \quad \text{Equation (1)}$$

where the onset potential values ($E_{red}$) are relative to the Ag/Ag$^+$ reference electrode. The valence band (VB) energy, $E_{VB}$ ($E_{HOMO}$) was calculated based on the band gap value determined from UV-Vis spectra, $E_{VB}$ ($E_{HOMO}$)=$E_{CB}$-$E_g$ (indirect). MA$_3$Bi$_2$I$_9$ films deposited on glass slides were dissolved in a solution of 0.1 M TBAPF$_6$, acetonitrile for conducting these tests.

All electronic transport property measurements were carried out in a commercial probe station with Cu—Be probe tips having 50 μm tip diameter. A source meter was used for resistivity measurements on MA$_3$Bi$_2$I$_9$ films deposited on 5 mm×5 mm high-purity quartz substrates. Van der Pauw structures were created by first sputtering 50 nm Pt on the four corners of the quartz substrates prior to MA$_3$Bi$_2$I$_9$ deposition. After MA$_3$Bi$_2$I$_9$ deposition, indium dots were attached to these four corners and served as the contact electrodes for the four probe tips. Corresponding Hall measurements were done by placing an Fe—Nd ring magnet around the sample. The magnetic field strength at the center of the ring magnet was 2135 G. The pressure in the chamber was maintained at or below 1×10$^{-4}$ Torr.

DFT Calculations

DFT calculations were performed using the Vienna ab-initio Simulation Package (VASP) and the Perdew-Burke-Ernzerhof exchange-correlation (XC) functional revised for solids (PBEsol). The core and valence electrons were modeled using the projector-augmented-wave (PAW) method. A plane-wave basis set with a cutoff of 500 eV was used and performed relaxation until the Hellmann-Feynman forces on the atoms were less than 0.001 eV/A. The Brillouin zone was sampled using a Gamma-centered Monkhorst-Pack points mesh while keeping the k-points density ($\eta\kappa \times a$) equal to ~26 for structural relaxation and ~52 for electronic structure calculations, where $\eta\kappa$ is the number of k-points and a is the lattice parameter. The spin-orbit coupling (SOC) effects were included for calculating the electronic band structure and the absorption spectra.

The charge partitioning for the Bader charge analysis was carried out. The elemental charges, used for Bader charge analysis, are the difference between the total valence electrons considered in the PAW potential and the total electrons assigned to an element after the charge density partitioning. The band-edge alignment for MA$_3$Bi$_2$I$_9$ was performed using a surface slab with material thickness of ~55 Å and a vacuum of ~50 Å. The valence band edge ($E_{VB}$) is calculated using the expression $E_{VB} = \varphi_{VAC} - \varepsilon_{VB}$, where $\varphi_{VAC}$ is the vacuum electrostatic potential and $\varepsilon_{VB}$ is the eigenvalue for the valence band maxima. The conduction band edge ($E_{CB}$) is calculated using the expression $E_{CB} = E_{VB} + E_G$, where $E_G$ is the band gap calculated using PBEsol with SOC.

Material Characterization

Figure 2A:
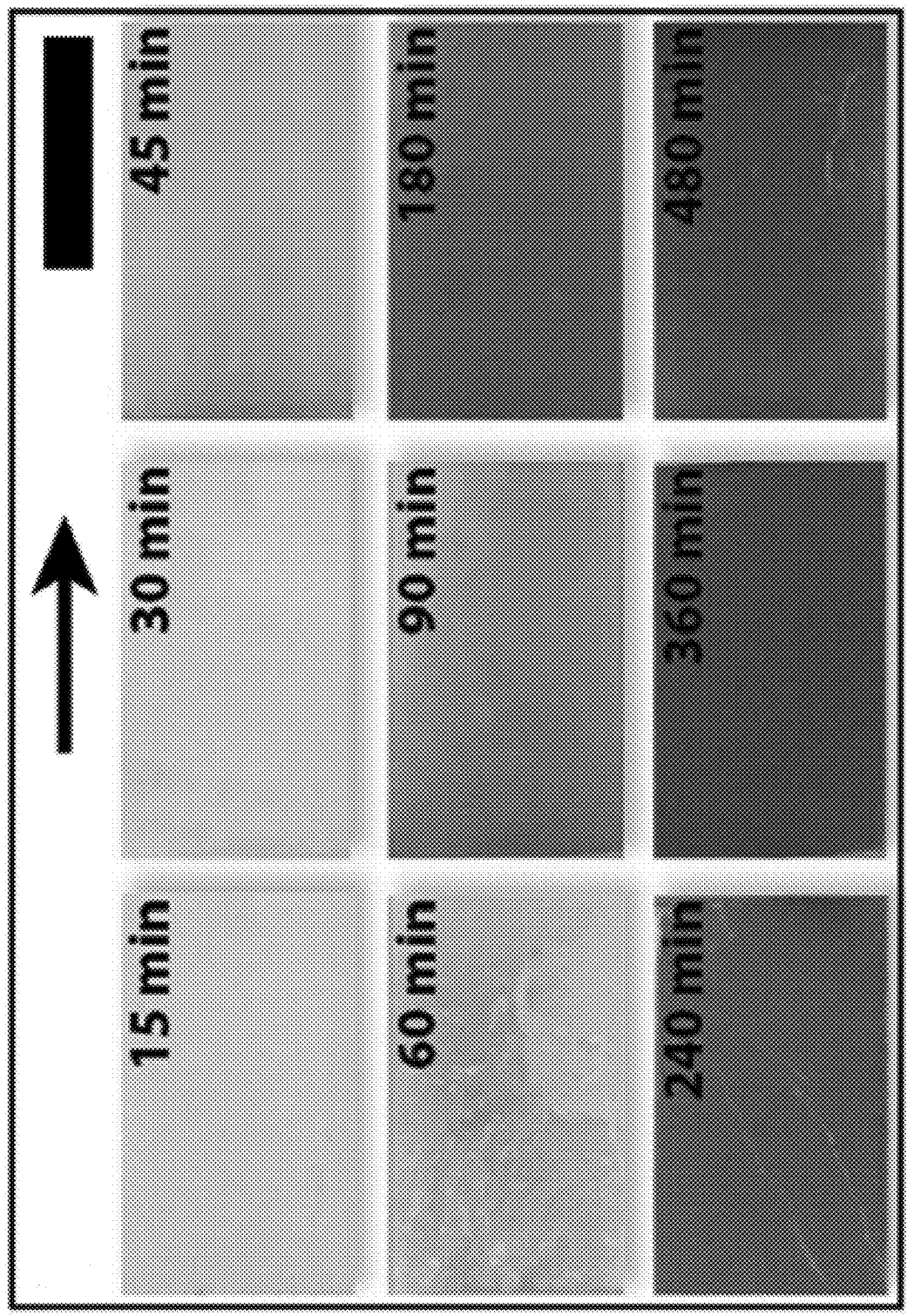
FIG. 2A is an exemplary embodiment of a time lapse series of optical images of a MA$_3$Bi$_2$I$_9$ thin film in accordance with the present disclosure.
Figures 2B, 2C:
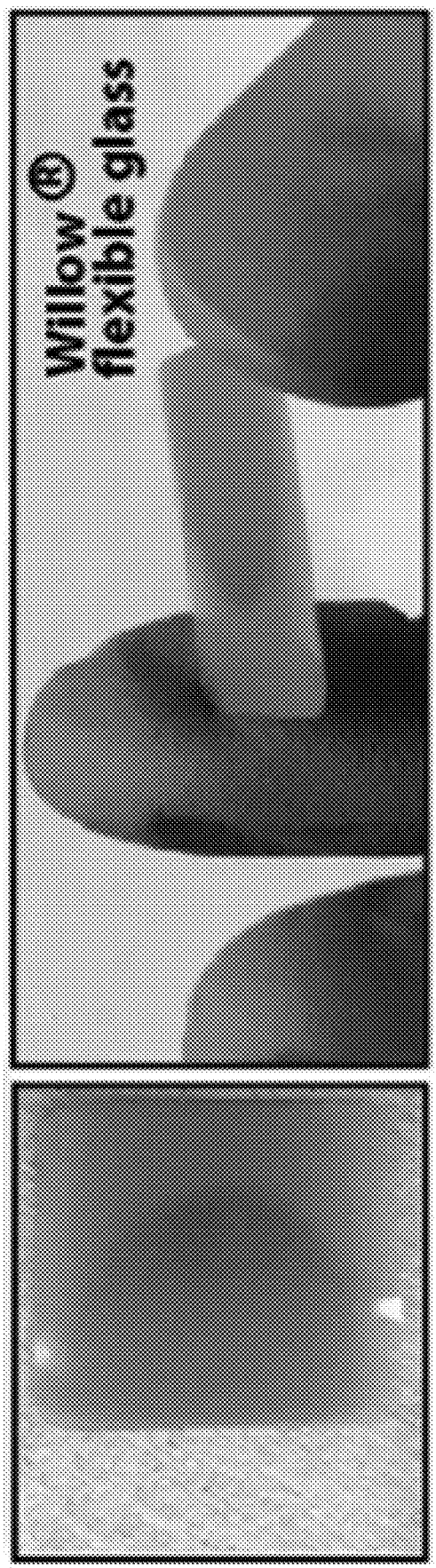
FIG. 2B is an exemplary embodiment of an optical image of a MA$_3$Bi$_2$I$_9$ thin film after 360 minutes in accordance with the present disclosure.
FIG. 2C is an exemplary embodiment of a thin film on WILLOW® flexible glass in accordance with the present disclosure.

FIG. 2A shows the color of the films on glass substrates as a function of deposition time. Initially, for short times (<60 minutes), very little deposition was observed. After 90 minutes of reaction, a visible orange color is seen on the glass substrate. A stronger color close to the upstream side of the sample, indicating that the deposition is determined by the Ar flow. For films ≥180 minutes, a continuous film is observed on the glass substrate. Deposition of MA$_3$Bi$_2$I$_9$ films on WILLOW® glass—Corning's flexible glass substrate, is shown in FIG. 2B and FIG. 2C. These flexible glass substrates can withstand temperatures up to 500° C. and can be used for the APCVD of MA$_3$Bi$_2$I$_9$ films.

Figure 11:
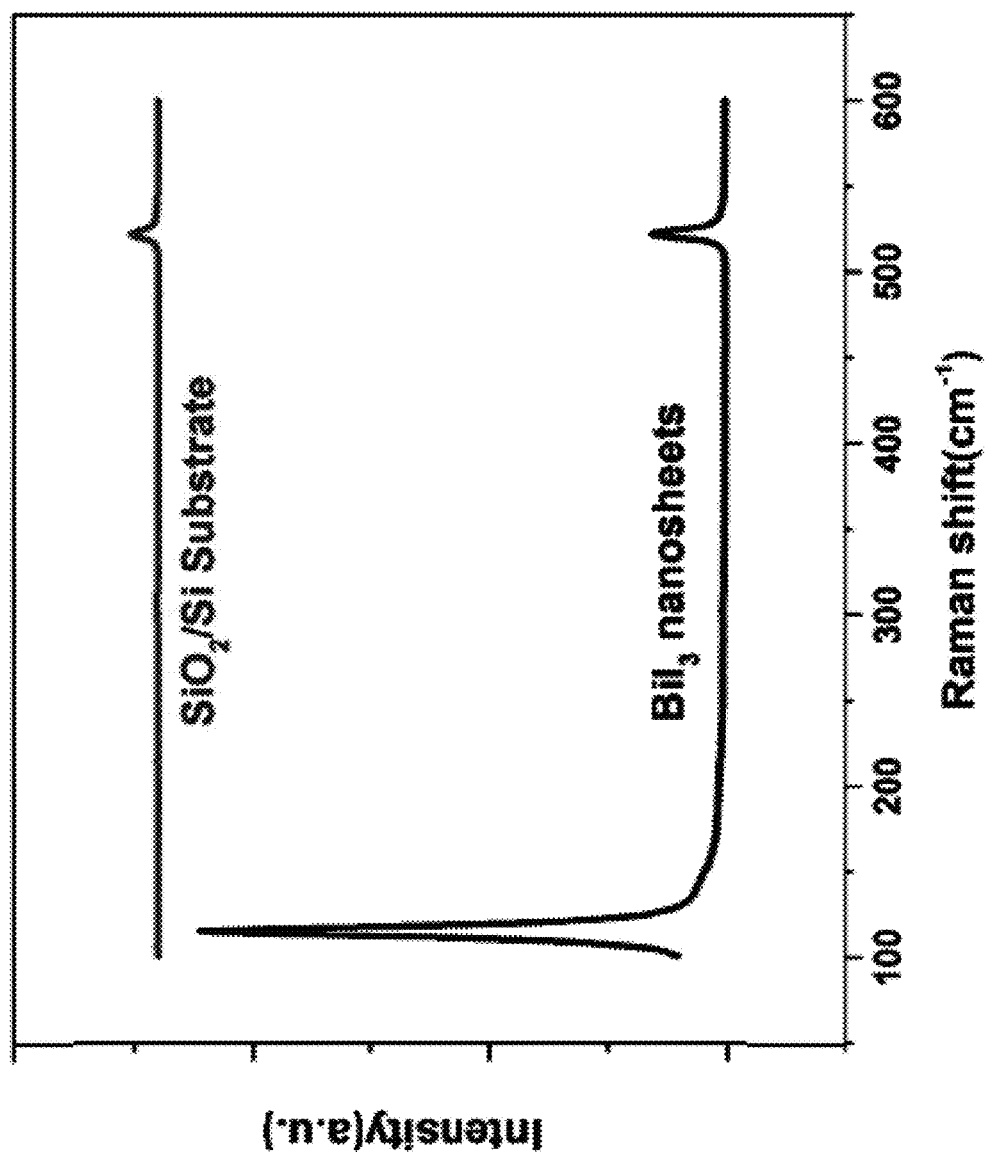
FIG. 11 is an exemplary embodiment of the Raman spectra of BiI$_3$ in accordance with the present disclosure.

High-magnification SEM images are shown for the same substrates in FIG. 3. Mechanistic aspects of the deposition process can be garnered from this sequence of images. First, FIGS. 3A, 3B and 3C (i.e., for deposition times 15, 30 and 45 minutes) show isolated hexagonal crystals growing in size from 0.5 μm for 15 minutes, to 1.0 μm for 45 minutes of deposition. The crystal shape is characteristic of BiI$_3$ and has been confirmed by Raman (FIG. 11) and XRD measurements. Thus, in the initial part of the deposition scheme, isolated BiI$_3$ crystals 0.5-1.0 μm in diameter are deposited on the substrate surface.

The BiI$_3$ crystals show signs of MAI incorporation starting at 60 minutes (FIG. 3D). While the crystal shapes remain intact, the surface of the crystal shows marked roughness. For 90 minutes (FIG. 3E), the deposited structure becomes interconnected. The interconnected structure shows signs of growth for 180 minutes (FIG. 3F) while the surface structure is rough and full of pinholes.

The surface structure further changes for the 240-minute sample (FIG. 3G), where well-crystallized MA$_3$Bi$_2$I$_9$ grains are visible, though evidence of MAI incorporation can still be seen at the grain boundaries. For the 360-minute sample (FIG. 3H), the MA$_3$Bi$_2$I$_9$ polycrystalline grains are well developed, indicating complete incorporation of the MAI. For the 480-minute sample (FIG. 3I), secondary nucleation of grains in between larger polycrystalline grains is observed.

The secondary nucleation of the MA$_3$Bi$_2$I$_9$ crystals observed in the intergranular regions of the film has been used to grow a dense, compact and polycrystalline film. In FIG. 4A, a low-magnification image of the 360-minute sample is shown. The intergranular regions are clearly observed and, as indicated before, are sites for secondary nucleation after 480 minutes of deposition. Therefore, repeating the process twice (labeled henceforth as, 360 minute (2×)), can eliminate these gaps and produce a film with dense morphology. This is shown in FIG. 4B. While such an approach may see excessive long deposition times, its need is dictated primarily by the limited mass loading of the MAI and BiI$_3$ precursors in our sublimation crucibles. Larger furnace reactors may easily overcome such hardware limitations and yield dense films in a single process run. The 'twice deposited' films were subsequently used to conduct all optical and electrical measurements.

Figure 5A:
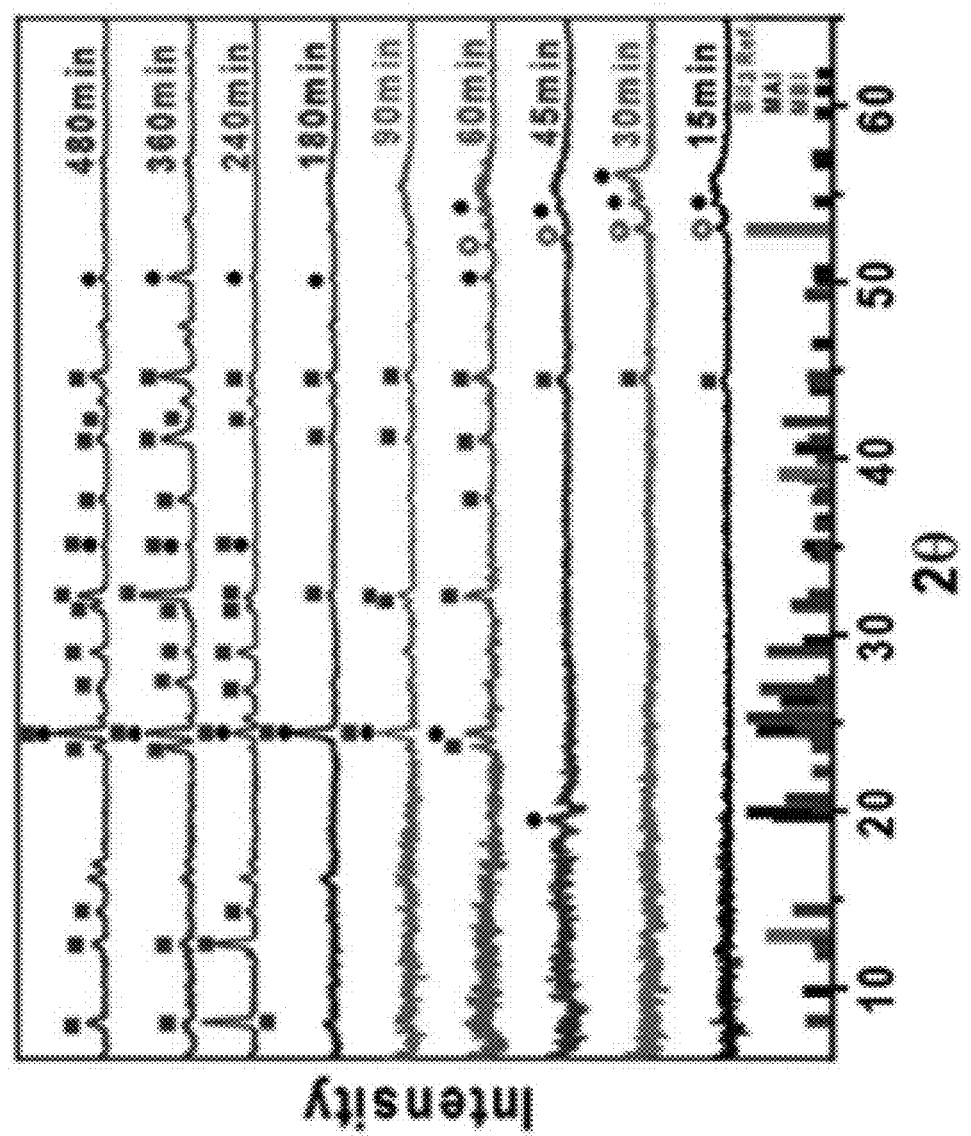
FIG. 5A is an exemplary embodiment of the XRD of a MA$_3$Bi$_2$I$_9$ film in accordance with the present disclosure.

XRD data of all the MA$_3$Bi$_2$I$_9$ samples deposited for various times are shown in FIG. 5A. For times between 15-60 minutes, clear diffraction peaks of BiI$_3$ with symbol 'O' can be seen. The peak at 2θ=52.9° can be indexed to BiI$_3$ (0012). The other peaks represent MAI, marked by the symbol '•', (JCPDS ref no. 000-10-0737). There is also a peak for MA$_3$Bi$_2$I$_9$ at 2θ=44.5°, but it is weak and gradually starts to increase in intensity only after 45 minutes of deposition. Here, it is noted that there are no JCPDS files available for MA$_3$Bi$_2$I$_9$, and the patterns generated were used to index the peaks.

After 60 minutes, the presence of MA$_3$Bi$_2$I$_9$ is detectable through XRD. The MA$_3$Bi$_2$I$_9$ phase is denoted by the '■' symbol. The primary peaks are at 2θ=24.48°, 32.30°, and 44.62° corresponding to (006), (025) and (220), respectively. These results are in line with SEM data which show the MAI incorporation begins at 60 minutes of deposition time. A texturing effect is observed for the 180-minute sample where the primary peak at 2θ=24.48° is observed. However, given that there are multiple peaks all corresponding to MA$_3$Bi$_2$I$_9$, the peak at 2θ=24.48° is most likely from the MA$_3$Bi$_2$I$_9$ phase. A transient texturing effect was observed that could be indicative of a topotactic transformation between MAI and $MA_3Bi_2I_9$. Beyond the 180-minute sample, the XRD patterns are characteristically polycrystalline with multiple peaks, all assignable to $MA_3Bi_2I_9$. These data are consistent with the SEM data since polycrystallinity is shown in SEM images for 240-, 360- and 480-minute samples.

Figure 5B:
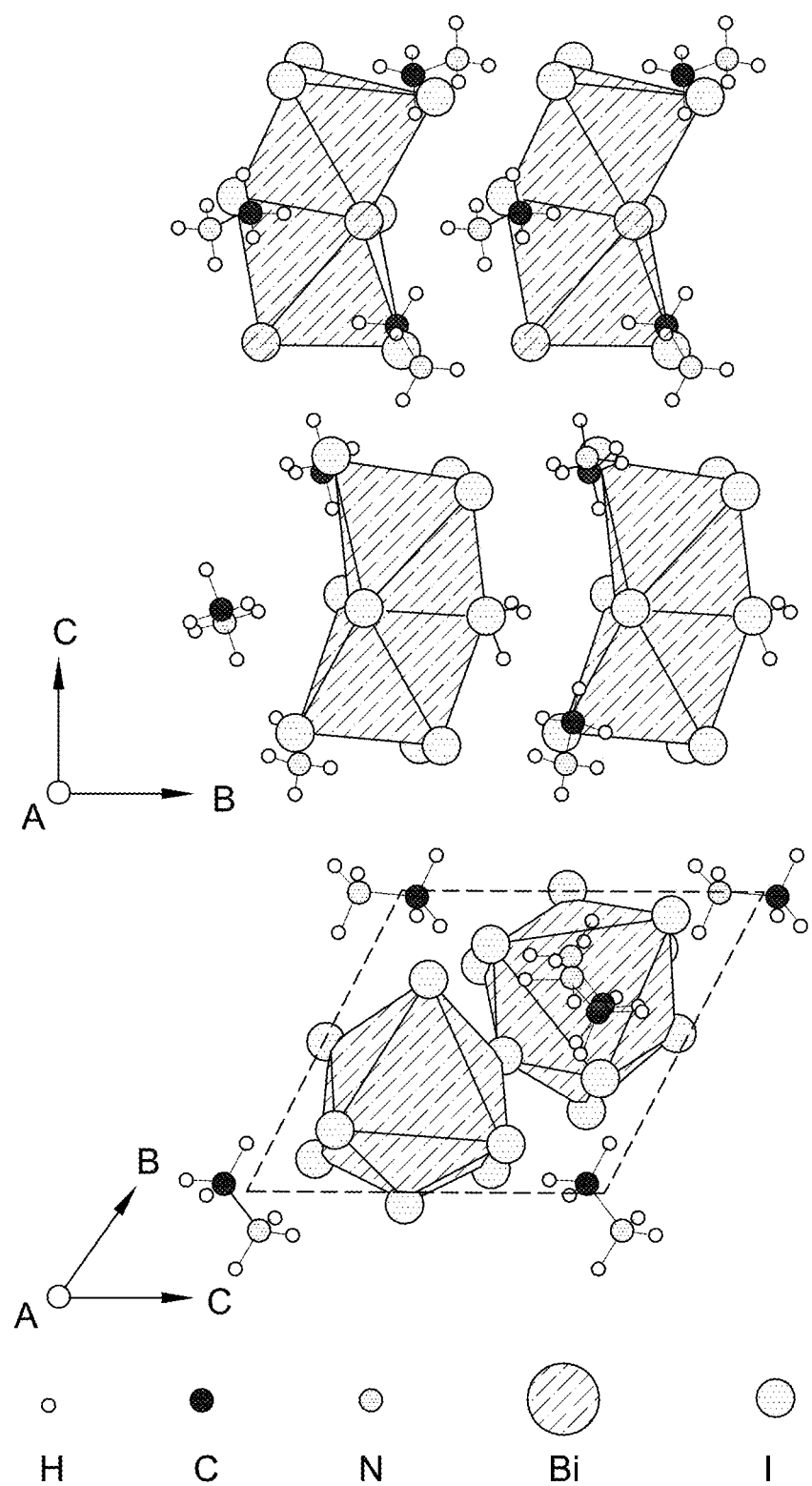
FIG. 5B is an exemplary embodiment of the crystal structure of MA$_3$Bi$_2$I$_9$ in accordance with the present disclosure.

The lattice parameters from the XRD results were compared to the crystal structure data obtained from first-principles DFT calculations. $MA_3Bi_2I_9$ exhibits hexagonal crystal symmetry at room temperature with a $P6_3/mmc$ space group. The methylammonium cation ($CH_3NH_3^+$ ($MA^+$)) shows no preferential ordering in the hexagonal phase. FIG. 5B shows the DFT-optimized crystal structure of $MA_3Bi_2I_9$ oriented along [100] and [001] directions. The geometry optimization was performed using PBEsol, which gives good agreement between the theoretical lattice parameters and the experimental values. The calculated lattice parameters from DFT are 8.72 Å, 8.27 Å and 21.76 Å, which are, respectively, within 1.77%, 3.47% and 0.01% of the experimental lattice parameters of the hexagonal phase. Because a static ground-state orientation of the MA cation in the DFT calculations was used, the ideal hexagonal $P6_3/mmc$ symmetry of the lattice is broken, which results in lowering of the symmetry for the relaxed structure. Instead the DFT relaxed structure exhibits a monoclinic symmetry with space group symmetry Cc, which is a subgroup of $P6_3/mmc$.

The $MA_3Bi_2I_9$ structure is a derivative of the perovskite ($ABX_3$) structure. In both cases the B-site cation (Bi in case of $MA_3Bi_2I_9$) is octahedrally coordinated by X-site anions (I in case of $MA_3Bi_2I_9$). However, as compared to the ideal perovskite structure, only ⅔rd of the total octahedral sites are occupied by the Bi cation in $A_3Bi_2I_9$ compounds. Additionally, as opposed to the corner-connected octahedral network of $BX_6$ octahedra in perovskites, $MA_3Bi_2I_9$ forms a layered structure consisting of isolated $Bi_2I_9^{3-}$ bioctahedra. These bioctahedra are formed by two face-shared $BiI_6$ octahedra, which share three I anions (FIG. 5B).

Figure 12:
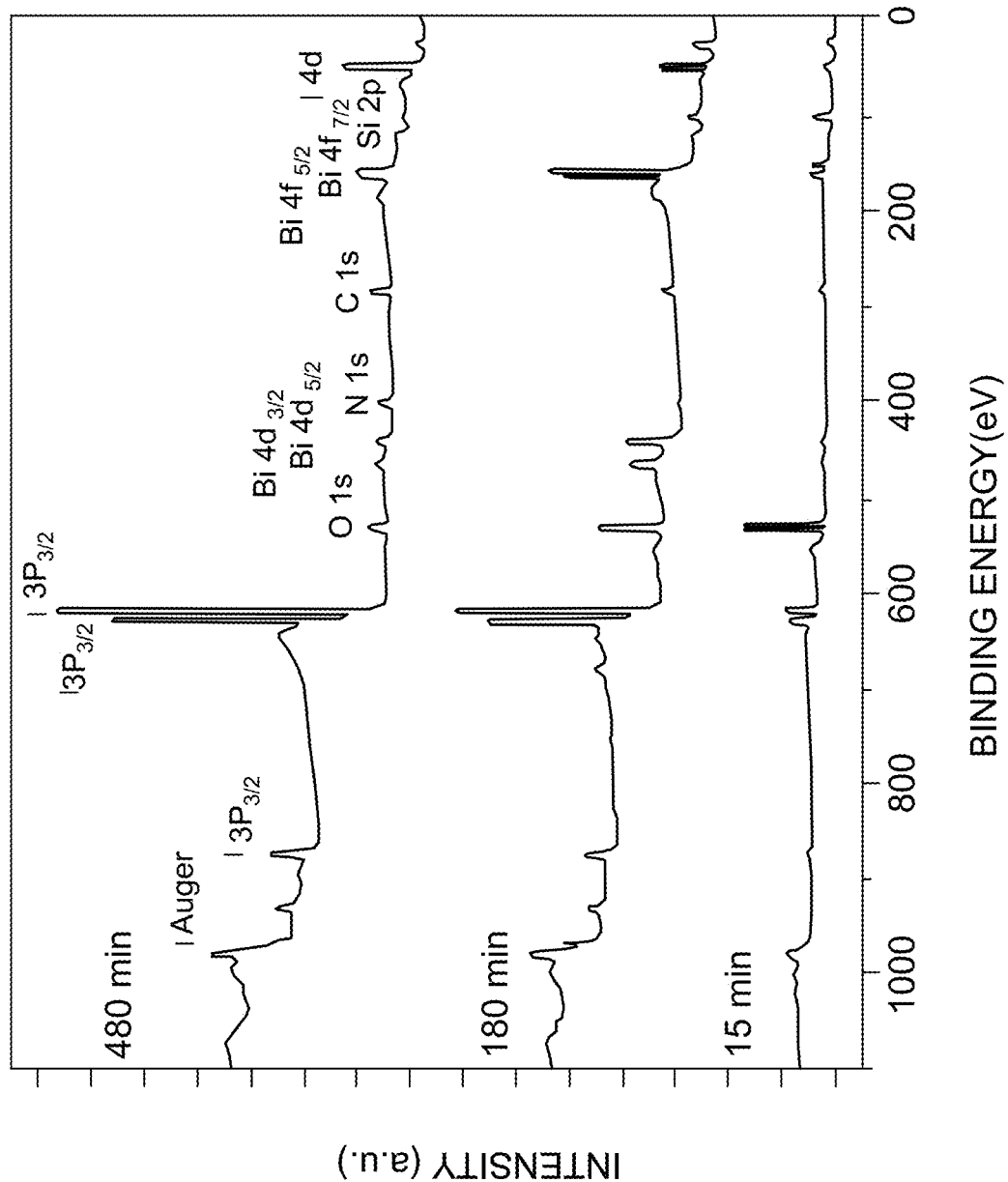
FIG. 12 is an exemplary embodiment of the XPS spectra of MA$_3$Bi$_2$I$_9$ film at different times in accordance with the present disclosure.

FIG. 6 shows the XPS fine spectra of the 15-, 180- and 480-minute $MA_3Bi_2I_9$ films whereas the full survey spectra of these samples are provided in FIG. 12. In FIG. 6A, the C 1s fine spectrum is shown. For the 15-minute sample, the primary peak is at 284.5 eV corresponding to the C—C bond related to adventitious carbon. There is a slight shoulder detected at 282.6 eV, which is related to the C—N bond originating from MAI. The CN bond increases in strength for the 180-minute sample and dominates the C 1s signal for the 480-minute sample. These data suggest that MAI incorporation in the $BiI_3$ is a slower process than the $BiI_a$ deposition, nucleation and growth process. This conclusion agrees with earlier observations made from vapor pressure calculations in Table 1 as well as SEM images in FIG. 3.

Figure 6A:
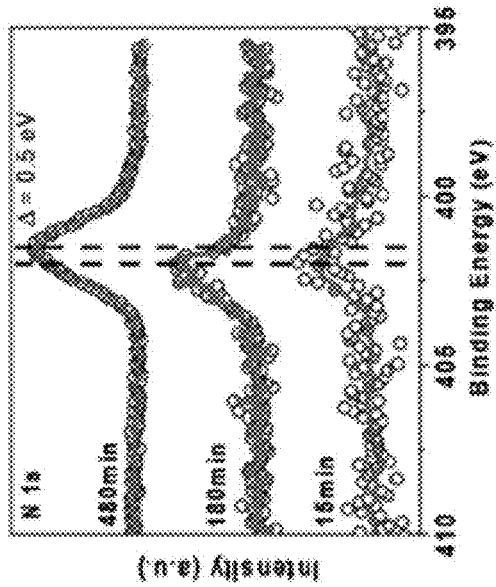
FIG. 6A is an exemplary embodiment of the XPS fine spectra of C is in accordance with the present disclosure.
Figure 6C:
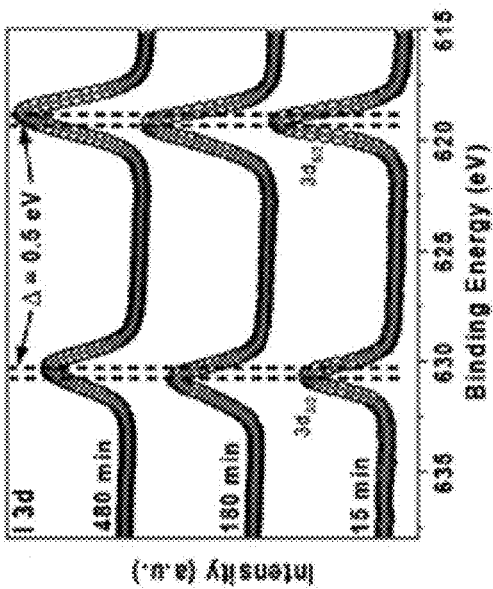
FIG. 6C is an exemplary embodiment of the XPS fine spectra of Bi 4f in accordance with the present disclosure.
Figure 6B:
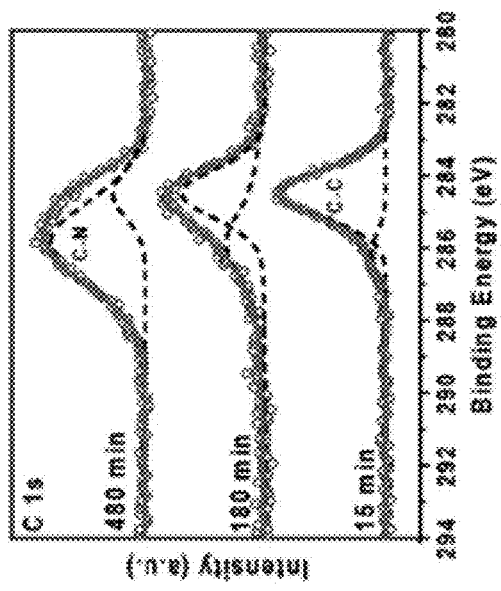
FIG. 6B is an exemplary embodiment of the XPS fine spectra of N 1 s in accordance with the present disclosure.
Figure 6D:
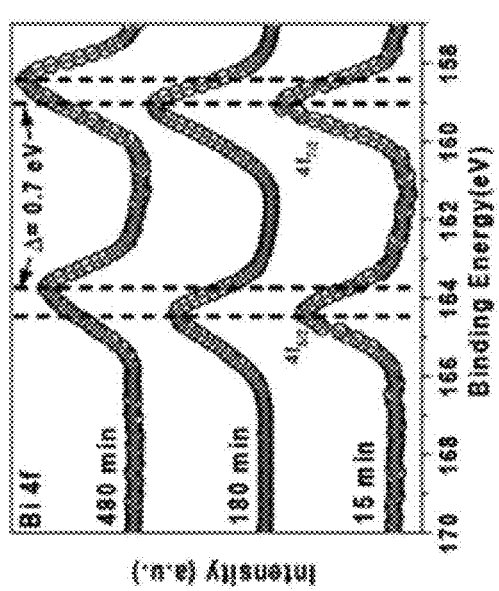
FIG. 6D is an exemplary embodiment of the XPS fine spectra of I 3d in accordance with the present disclosure.

N 1s, Bi 4f and I 3d XPS fine spectra are provided in FIGS. 6B, 6C and 6D, respectively and the peak positions are shown in Table 2. For the N 1s, the 15-minute sample shows a weak signal but progressively grows stronger for the 180- and 480-minute samples indicating $Ma^+$ incorporation. The N 1s peak position shifts to lower binding energy from 402.0 eV to 401.5 eV. The Bi 4f and I 3d peaks are strong even at 15 minutes and indicate the presence of $BiI_3$. $Ma^+$ incorporation produces a shift to lower binding energy of 0.7 eV and 0.5 eV in the Bi 4f and I 3d peaks, respectively. The peak-shifts indicate electron transfer to the N, Bi and I during the transformation of $BiI_a$ to $MA_3Bi_2I_9$.

TABLE 2

XPS Peak Positions

| | Binding Energy (eV) | | |
|---|---|---|---|
| Sample | N 1s | Bi $f_{7/2}$ | I $3d_{5/2}$ |
| 15 min | 402.0 | 159.1 | 619.3 |
| 180 min | 402.0 | 159.0 | 619.2 |
| 480 min | 401.5 | 158.4 | 618.8 |

To explain the shifts in the XPS spectra, Bader charge analysis was performed for each element during the chemical reaction leading up to the formation of $MA_3Bi_2I_9$. The average Bader charges for each elemental species in $MA_3Bi_2I_9$, MAI and $BiI_3$ are shown in Table 3. Recall that in FIG. 6A, the intensity of the de-convoluted C—N peak increases as the reaction proceeds, indicating increased presence of C—N bond with increasing reaction time. The C—N bond occurs at a higher binding energy compared to the C—C bond, signifying loss of electrons in the C atom upon N addition. From the Bader analysis, the loss of electrons on the C atom is confirmed by the higher atomic charge on C in $MA_3Bi_2I_9$ (+0.453±0.015)e than in MAI (+0.445e). However, for N there is disagreement between the calculated charge transfer and the shift in XPS peak presented in FIG. 6B. According to calculated Bader charges, the average charge on N is (−2.982±0.009)e and (−3.029e) for $MA_3Bi_2I_9$ and MAI respectively, which means N anion is being oxidized while going from MAI to $MA_3Bi_2I_9$. However, this charge transfer is not supported by the shift in the XPS peak towards lower binding energy with increasing reaction time, which points towards the reduction (gain in electrons) of N anion. This disagreement could be attributed to the weak XPS intensity for N at reaction times of 15 and 180 minutes, which makes the determination of charge transfer difficult with the N 1s fine spectra.

TABLE 3

CALCULATED AVERAGE BADER CHARGES

| Element | $MA_3Bi_2I_9$ | MAI | $BiI_3$ |
|---|---|---|---|
| C | 0.453 ± 0.015 | 0.445 | |
| N | −2.982 ± 0.009 | −3.029 | |
| Bi | 1.049 ± 0.002 | | 1.061 |
| I | −0.472 ± 0.009 | −0.668 | −0.354 |
| H-1 (bonded to C) | 0.081 ± 0.013 | 0.084 ± 0.005 | |
| H-2 (bonded to N) | 1 | 1 | |

The Bi cations in $MA_3Bi_2I_9$ have an average charge of (+1.049±0.002)e compared to +1.061e in the precursor $BiI_3$ and are in a reduced state in $MA_3Bi_2I_9$ as compared to $BiI_3$. This reduction of the Bi cation is also supported by the shift in experimental XPS peak towards lower binding energy as shown in FIG. 6C. On comparing the average Bader charge of I anions in the primary precursors, i.e. the weighted average of the Bader charge of I in MAI and $BiI_3$ (−0.459e) to that in $MA_3Bi_2I_9$ (−0.472e), it was found that the I anions are also reduced. This gain of electrons is also confirmed by the shift of the XPS peak for I anion towards lower binding energy as shown in FIG. 6D. Moreover, the reduction of Bi and I ions in $MA_3Bi_2I_9$ with respect to the precursors (MAI and $BiI_3$) is accompanied by a simultaneous oxidation of the MA cations in $MA_3Bi_2I_9$ with respect to MAI, which balances out the net charge transfer. The net reduction of Bi and I requires a total charge transfer of 0.141e per formula unit of $MA_3Bi_2I_9$ to Bi and I (0.024e for Bi and 0.117e for I). This charge transfer is achieved by a transfer of electrons from MA cations to Bi and I as the reaction proceeds. The net average charge on MA cation is (+0.668e) and (+0.715e) in MAI and $MA_3Bi_2I_9$ respectively, which amounts to a net charge transfer of 0.141e per formula unit of $MA_3Bi_2I_9$ from MA to Bi and I.

Finally, the charge transfer in H can be categorized into two types, based on the position of H in the MA cations. H atoms directly bonded to C and those directly bonded to N lead to two different bonding environments. The H atoms bonded to N show an atomic charge of +1 for both $MA_3Bi_2I_9$ and MAI. Whereas, the H atoms bonded to C show an average atomic charge of +0.081 and +0.084 in $MA_3Bi_2I_9$ and MAI respectively. This difference in the atomic charge is due to the higher electronegativity of N than C, which renders the H—N bonds more ionic than the H—C bonds.

Optical Characterization

Figure 7B:
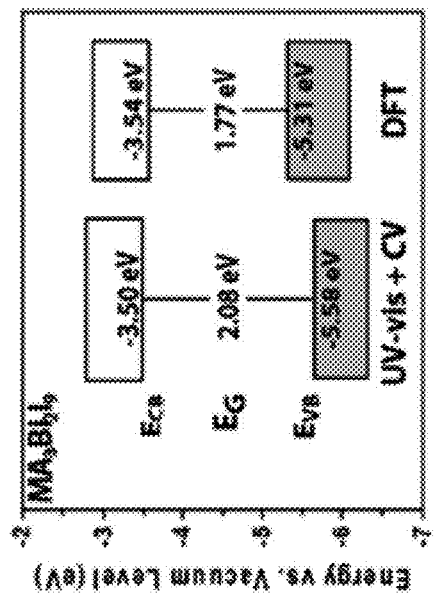
FIG. 7B is an exemplary embodiment of the DFT-calculated band structure for MA$_3$Bi$_2$I$_9$ in accordance with the present disclosure.
Figure 7A:
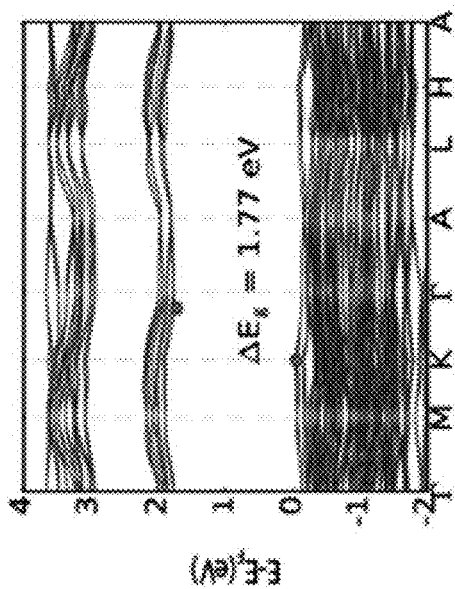
FIG. 7A is an exemplary embodiment of the UV-Vis spectra of a MA$_3$Bi$_2$I$_9$ film in accordance with the present disclosure.
Figure 13:
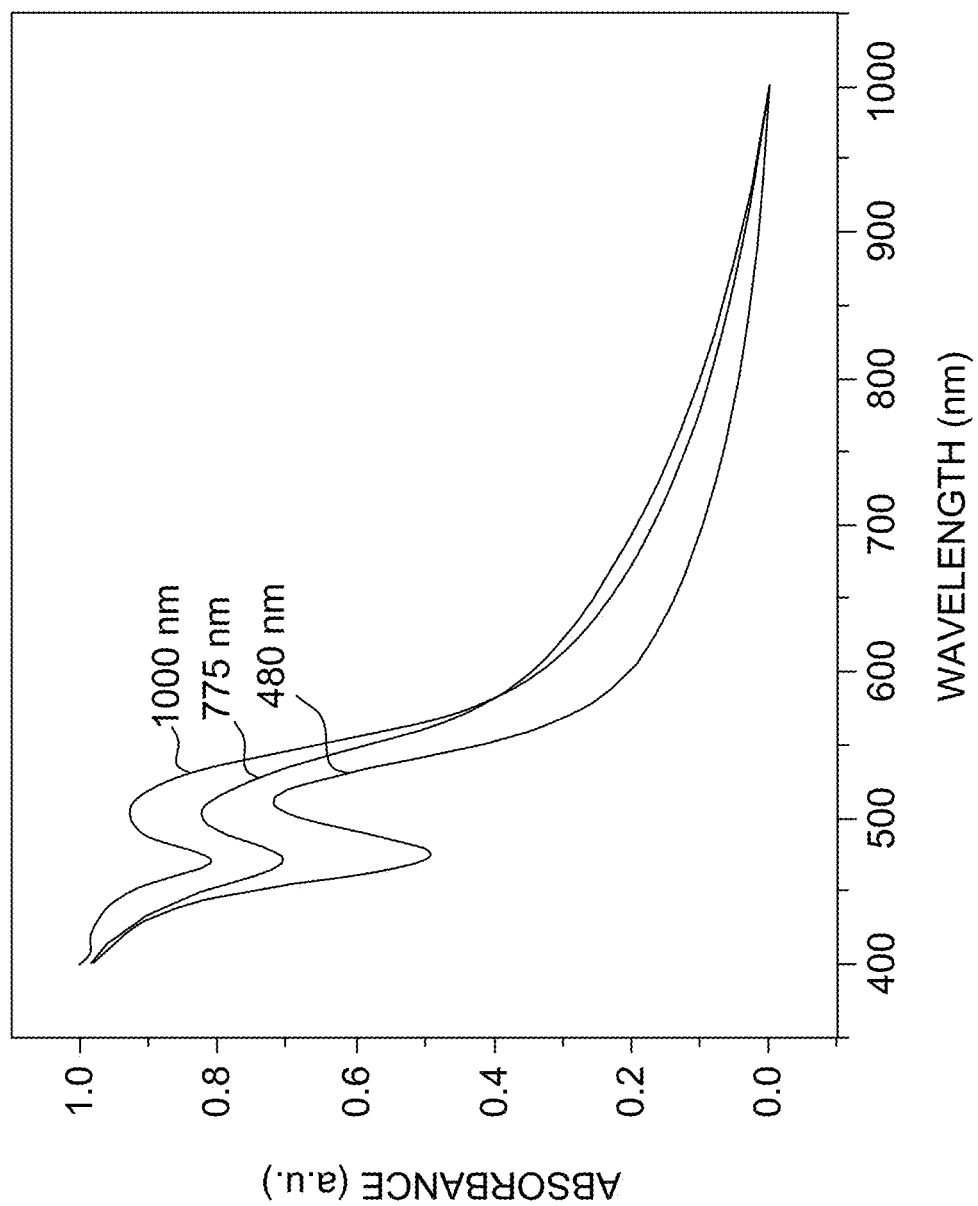
FIG. 13 is an exemplary embodiment of the normalized UV-Vis spectra of various thickness MA$_3$Bi$_2$I$_9$ films in accordance with the present disclosure.

FIG. 7A shows the UV-Vis absorption spectra of the 180 minute $MA_3Bi_2I_9$ film at wavelengths between 400 nm and 1000 nm. The absorption onset of $MA_3Bi_2I_9$ was observed at approximately 600 nm. The presence of a peak at 511 nm before the onset of continuous absorption is attributed to excitons. The MAI and $BiI_3$ absorption spectra do not contain an exciton peak. This exciton peak has also been observed for single crystals of $MA_3Bi_2I_9$ from temperatures between 78 K to 301 K, and it broadens as the temperature increases. The thickness dependence of the exciton levels is shown in FIG. 13 where a stronger and narrower exciton peak is observed for a thinner film (~480 nm), and a broader exciton peak is observed for a thicker (~1000 nm) film. The bandgap of $MA_3Bi_2I_9$ films was calculated first by establishing a baseline and removing the exciton peak from the absorption spectrum. Then by plotting the baseline as a Tauć plot and using the following equation:

$$\alpha h\nu = \beta(h\nu - E_g)^n \quad \text{Equation (2)}$$

where $\alpha$ is the absorption coefficient, $h\nu$ is the photon energy, $\beta$ is a constant, and $E_g$ is the bandgap; a linear fit is used to extract the bandgap. Assuming the lowest energy optical transition in $MA_3Bi_2I_9$ is indirect (see DFT calculations below), $n=\frac{1}{2}$ is used in the evaluation. The inset of FIG. 7A shows the Tauć plot, and the extrapolated bandgap is 2.08 eV. The value of the $MA_3Bi_2I_9$ bandgap is in line with those previously reported.

FIG. 7B shows the electronic band structure of $MA_3Bi_2I_9$ calculated using PBEsol with spin-orbit coupling (SOC) along the high symmetry points in the Brillouin zone. Using the PBEsol functional and SOC effects, it was found that $MA_3Bi_2I_9$ has an indirect band gap of 1.77 eV from K (⅓, ⅓, 0) in the valence band to (0.05, 0.05, 0) in the conduction band as shown in FIG. 7B. The calculated direct band gap is 1.89 eV and occurs at (0.075, 0.075, 0). $MA_3Bi_2I_9$ exhibits relatively flat bands as compared to $CH_3NH_3PbI_3$, which is typical for $A_3Bi_2I_9$ compounds because of the disrupted octahedral connectivity along all three crystallographic directions. The underestimation of the experimental band gap using the PBEsol functional is as expected. It has been previously shown that the hybrid Heyd-Scuseria-Ernzerhof (HSE06) functional, which is known to result in better band gap estimation for a variety of semiconductors, results in a band gap of 2.24 eV for $MA_3Bi_2I_9$, which is slightly above the experimental band gap of 2.08 eV obtained after deconvolution of the excitonic peak.

Figure 7D:
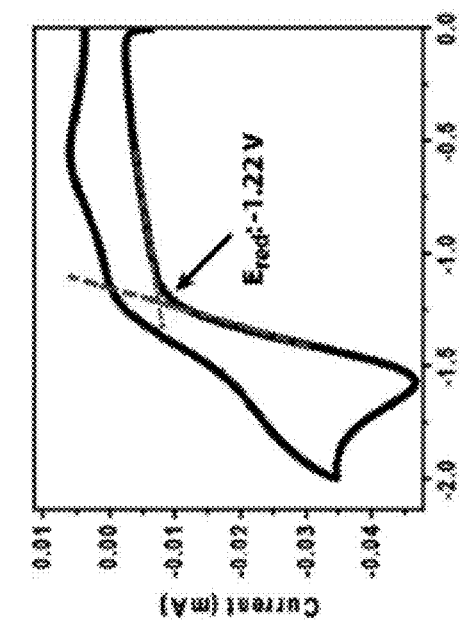
FIG. 7D is an exemplary embodiment of the band edge information from experimental calculations in accordance with the present disclosure.
Figure 7C:
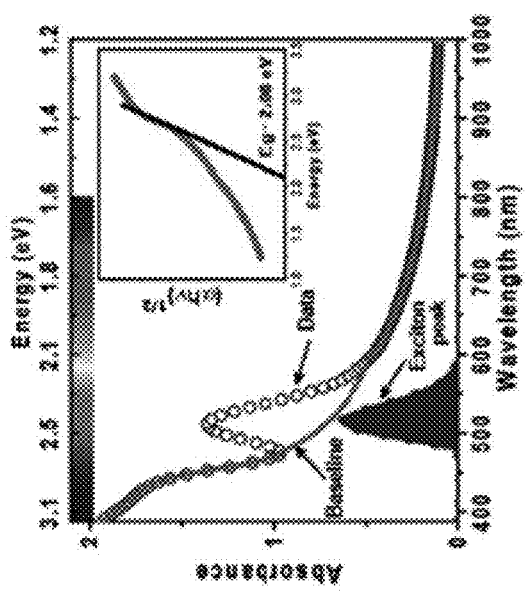
FIG. 7C is an exemplary embodiment of the cyclic voltammetry curve for MA$_3$Bi$_2$I$_9$ in accordance with the present disclosure.

To extract the experimental band edge positions of the $MA_3Bi_2I_9$, CV measurements are shown in FIG. 7C. $MA_3Bi_2I_9$ has the reduction peak edge at $E_{red}$=−1.22 V. Referring to Equation (1), the $MA_3Bi_2I_9$ conduction band edge position is therefore calculated as $E_{CB}$=−3.505 eV with respect to vacuum. Using the bandgap obtained from UV-Vis, the valence band edge position is calculated as $E_{VB}$=−5.58 eV. The data from UV-Vis+CV measurements and DFT calculations are summarized in FIG. 7D.

Electrical Characterization

Figure 14:
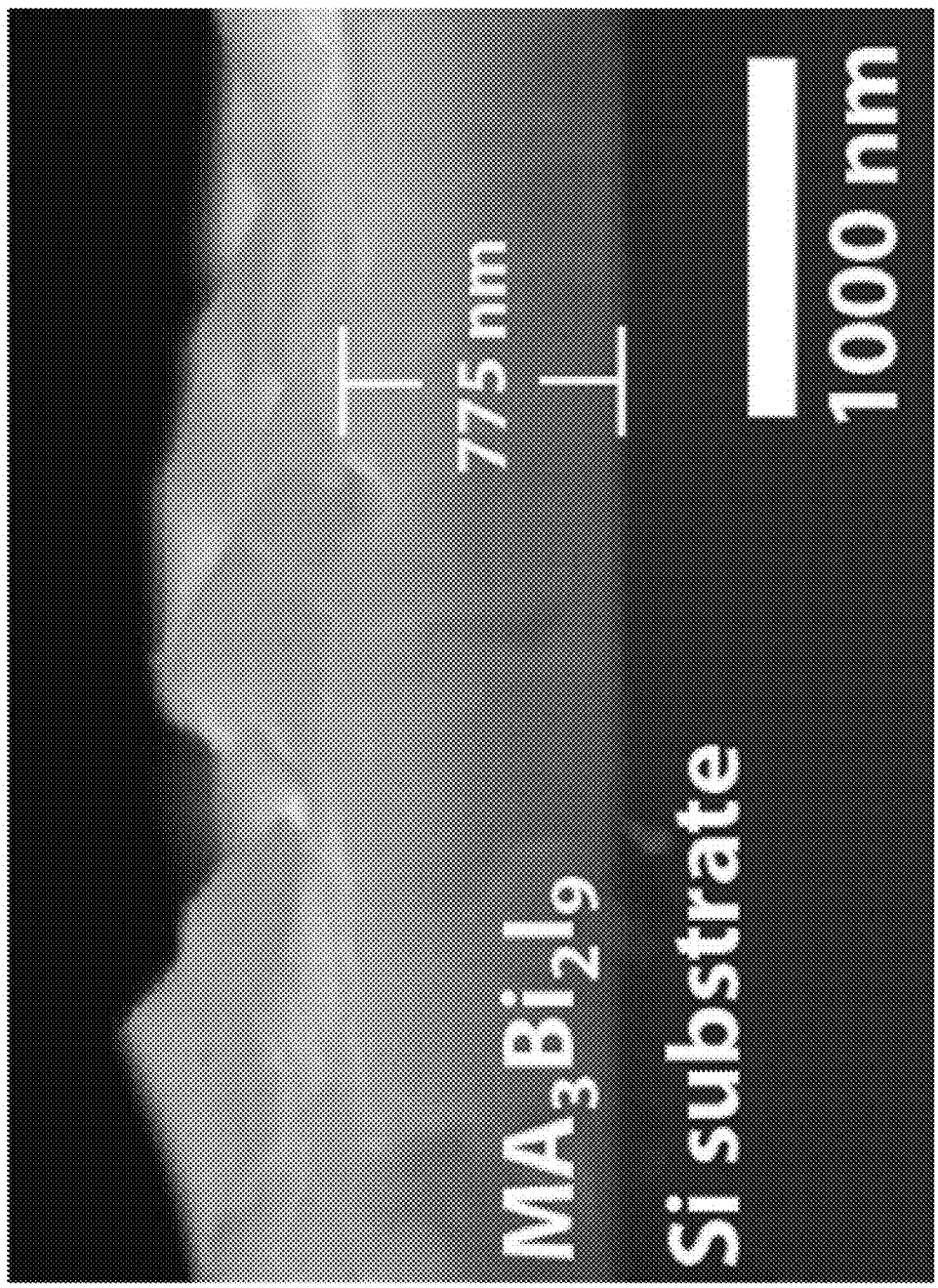
FIG. 14 is an exemplary embodiment of a cross-sectional SEM image of a MA$_3$Bi$_2$I$_9$ film in accordance with the present disclosure.

For the $MA_3Bi_2I_9$ film deposited twice (360 minute (2×)) on the quartz substrate, conductivity was measured using a van der Pauw four-point configuration. The conductivity is 9.7 S/cm (i.e., resistivity 0.103 Ω·cm) at room temperature for a film with a thickness of 775 nm (see FIG. 14 for thickness measurement using cross-section SEM image). The detailed result is shown in Table 4 along with comparison of electrical data from other reports. This conductivity is 1168× better than the reported conductivity (0.0083 S/cm) of a solution-processed, 500 nm $MA_3Bi_2I_9$ film highlighting the importance of the type of synthesis in determining film properties.

TABLE 4

Comparative Hall Measurement data for $MA_3Bi_2I_9$

| Synthesis Process | Thickness (nm) | Conductivity (S/cm) | Mobility ($cm^2/V \cdot s$) | Carrier density ($cm^{-3}$) |
|---|---|---|---|---|
| APCVD (360 min, 2x) | 775 | 9.7 | 18.0 | n-type $3.36 \times 10^{18}$ |
| Solution Process | 500 | 0.0083 | 1.0 | p-type $10^{16}$ |
| Solution Process, S-doped | unknown | 839 | 2.28 | p-type $2.3 \times 10^{21}$ |

Room temperature Hall measurement was performed to determine conductivity type, carrier mobility and concentration of the $MA_3Bi_2I_9$ film. According to the measurements, the Hall coefficient is negative, which indicates the carriers to be n-type for the CVD $MA_3Bi_2I_9$ film. This result is in contrast to the solution processed $MA_3Bi_2I_9$ film which shows p-type conductivity. Further, the calculated carrier concentration of the CVD $MA_3Bi_2I_9$ film is $3.36 \times 10^{18}$ $cm^{-3}$, which is 2 orders higher in magnitude than solution-based, undoped $MA_3Bi_2I_9$ films. Finally, the mobility was estimated to be 18 $cm^2/V \cdot s$. This is higher compared to the mobility reported previously, of 1 $cm^2/V \cdot s$ and of 2.28 $cm^2/V \cdot s$.

Figure 8B:
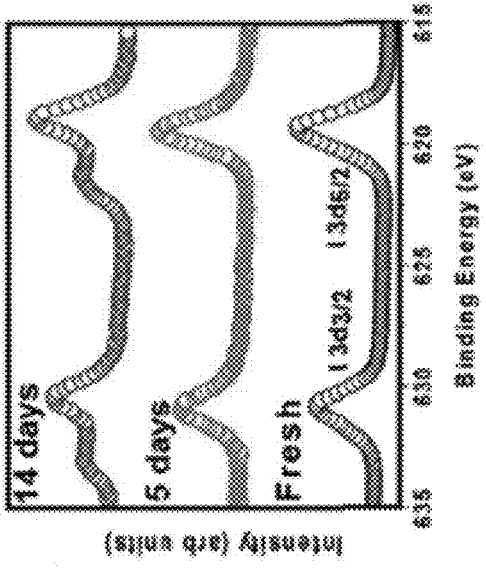
FIG. 8B is an exemplary embodiment of the XPS fine spectra for I 3d in accordance with the present disclosure.
Figure 8A:
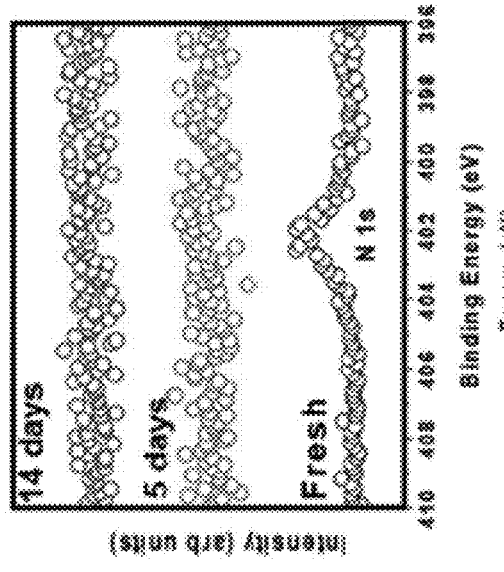
FIG. 8A is an exemplary embodiment of the XPS fine spectra for N 1s in accordance with the present disclosure.
Figure 15B:
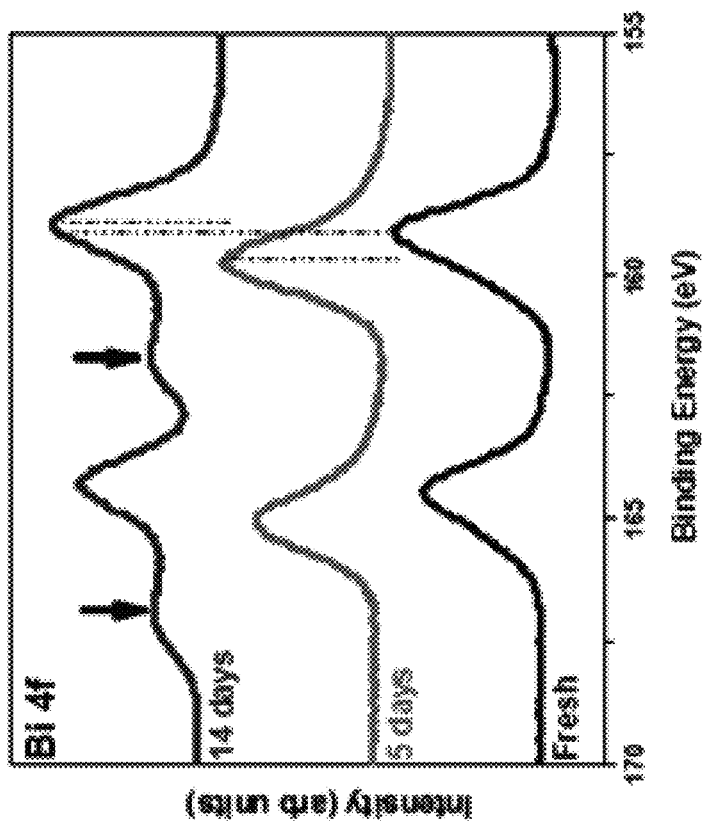
FIG. 15B is an exemplary embodiment of XPS fine spectra of Bi 4f in accordance with the present disclosure.
Figure 15A:
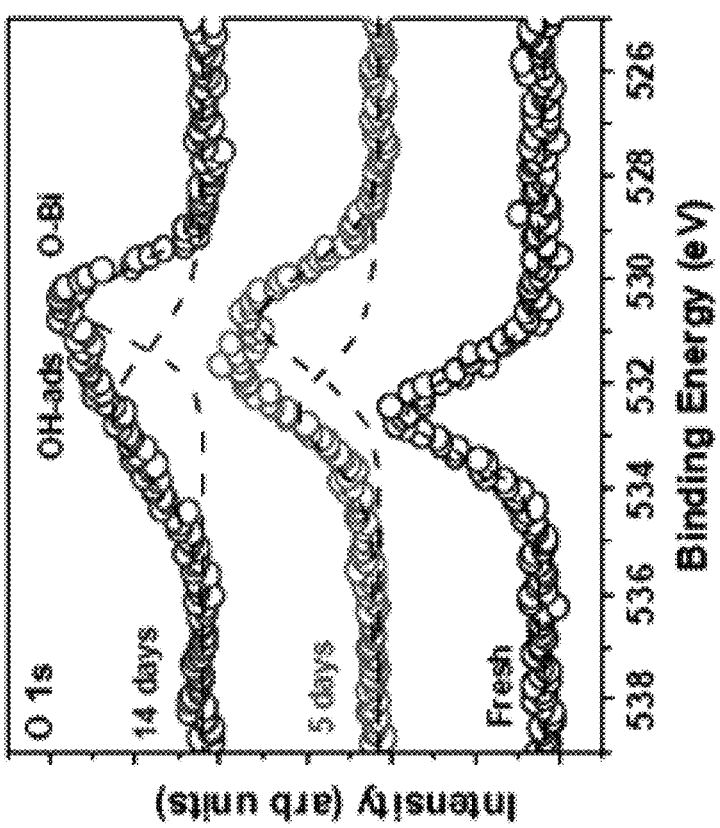
FIG. 15A is an exemplary embodiment of the XPS fine spectra of 0 is in accordance with the present disclosure.

Film Stability $MA_3Bi_2I_9$ is stable in ambient conditions presenting a significant advantage over other organic halide perovskite candidates. In FIG. 8A, a loss of N is detected in the $MA_3Bi_2I_9$ film exposed to ambient conditions after 5 days. The absence of N has been observed previously for degraded Pb-based perovskite films as well. Further, in FIG. 15, the XPS 1s fine spectra of O and 4f fine spectra of Bi in the $MA_3Bi_2I_9$ film is shown. The O is shows the characteristic O peak associated with surface adsorbed hydroxyl groups with an additional shoulder corresponding to Bi—O bond formation after 5 days and growing stronger after 14 days of exposure to the ambient. Similarly, the Bi 4f shows signs of oxidation as well after 5 days. FIG. 8B shows XPS fine spectra of I $3d_{7/2}$ and $3d_{5/2}$ for fresh films and for films exposed 5 and 14 days to the ambient. Unlike N and O, there is no noticeable change observed to the I 3d fine spectra after 5 days. However, shoulders appear for the I $3d_{7/2}$ and $3d_{5/2}$ peaks on the higher binding energy side after 14 days, indicating oxidation of I.

Figure 8D:
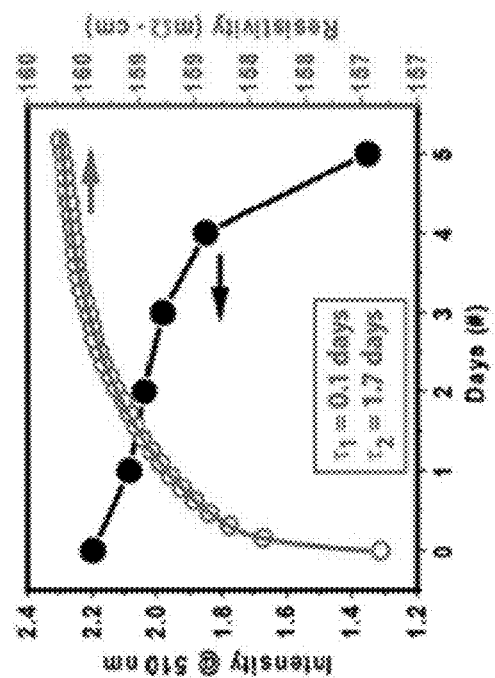
FIG. 8D illustrates an exemplary embodiment of the change in exiton peak intensity over time in accordance with the present disclosure.
Figure 8C:
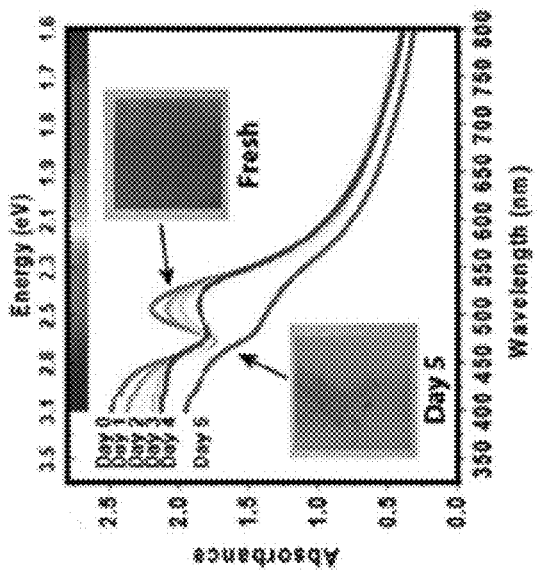
FIG. 8C is an exemplary embodiment of the UV-Vis spectra of a MA$_3$Bi$_2$I$_9$ at different time points in accordance with the present disclosure.

The compositional changes in the $MA_3Bi_2I_9$ are accompanied by changes to optical and electrical properties. FIG. 8C shows the UV-Vis absorption spectra of the $MA_3Bi_2I_9$ film exposed to ambient conditions over a period of 5 days. The characteristic 510 nm exciton peak disappears on day 5. Correspondingly, the insets in FIG. 8C show the film changes color from bright orange to a pale shade of yellow. In FIG. 8D, the excitonic intensity at 510 nm (black, left axis) and the 4-wire resistivity (red, right axis) are plotted as a function of time over a five day period. A bi-exponential model involving two time constants is used to fit the increase in resistivity over time. Two time constants, $\tau_1=0.1$ day and $\tau_2=1.7$ days are obtained with a model fit that has an adjusted $r^2 \approx 0.99$.

The XPS analysis along with the bi-exponential decay of resistance suggests two decay mechanisms might be operative in degrading the $MA_3Bi_2I_9$ films. First, the time constant $\tau_1=0.1$ day could indicate surface oxidation of $MA_3Bi_2I_9$ where the Bi may be oxidized to $Bi_2O_3$. In line with this assumption, it can be seen that the exciton peak intensity only slightly degrades in the initial period. This is because the surface $Bi_2O_3$ layer may provide temporary protection from further attack by ambient $O_2$, keeping the excitonic modes active in the bulk. In contrast, $\tau_2=1.7$ days indicates the slower diffusion-limited oxidation of the bulk $MA_3Bi_2I_9$, and as the film gets oxidized after day 4, the exciton peak intensity rapidly degrades.

Memristor Preparation

A memristor was prepared as a bottom conducting electrode deposited on a silicon wafer (preferably a noble metal such as Au or Pt or, an electrically conducting oxide such as indium tin oxide). A $MA_3Bi_2I_9$ film was deposited as described elsewhere herein. The film thickness was varied from a few tens of nanometers to a few hundreds of nanometers. The switching speed and resilience of the structure is expected to be thickness dependent. On top of the $MA_3Bi_2I_9$ film was deposited a second conducting electrode. The material used for the top electrode can be a noble metal such as Au or Pt or, an electrically conducting oxide such as indium tin oxide. This electrode is usually patterned into areas as large as a few $mm^2$.

Figures 16A, 16B:
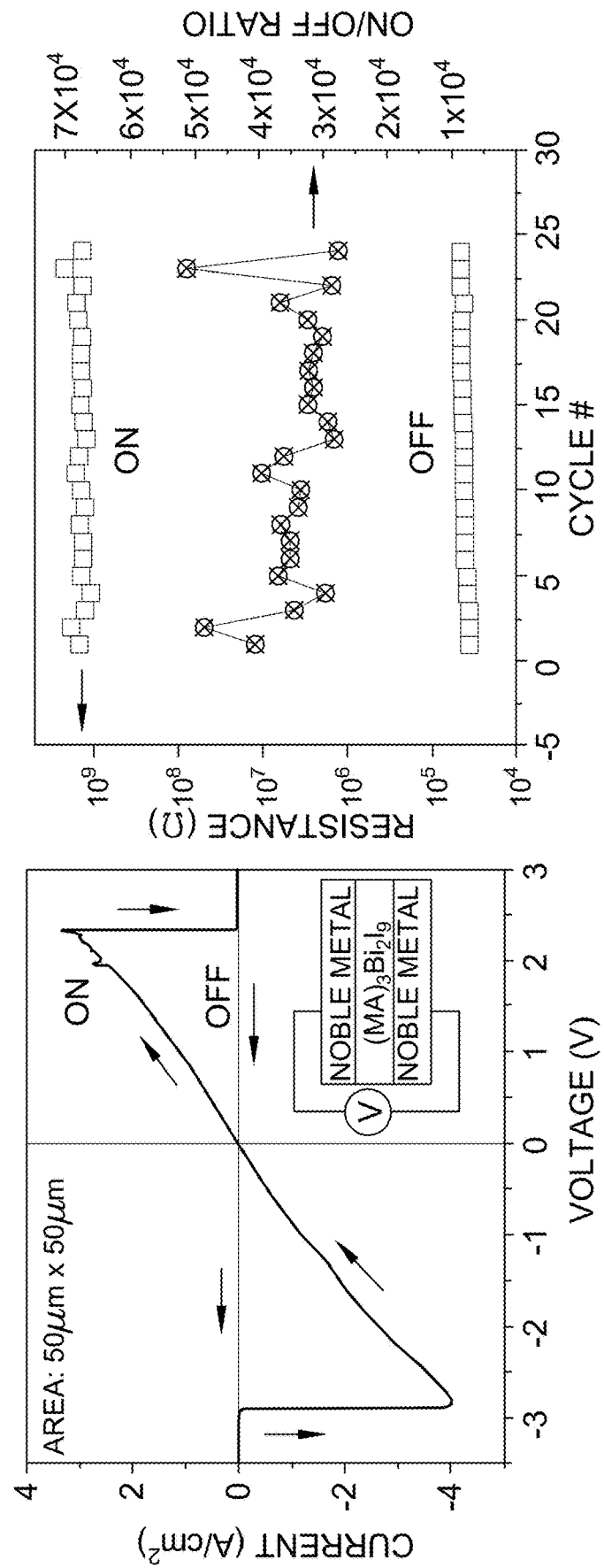
FIG. 16A is an exemplary embodiment of the IV of MA$_3$Bi$_2$I$_9$ showing resistive switching in accordance with the preset disclosure.
FIG. 16B is an exemplary embodiment of an illustration of the high and low states of a memristor cycled 25 times in accordance with the present disclosure.

The testing procedure involves the use of a probe station with micro-positioners controlling the movement of probe needles. The probe needles are attached to a source that measure units which apply voltage and measure current or vice versa. While the top and bottom electrodes are in electrical contact with the probe needles, the voltage is swept from 0 V to a positive bias (+V) and swept back to the negative bias (-V) and back to 0 V. This voltage sweep constitutes one cycle. Current is recorded continuously. The cycle is repeated as many times as desired (usually 100s of cycles are performed) and the current voltage characteristics are plotted as a function of cycle number. FIGS. 16A and 16B graph the results of one experiment where the memristor was cycled 25 times as described herein.

Device Experimental Section

Sample Preparation:

Methylammonium iodide (MAI) was synthesized by reacting methylamine solution with hydroiodic acid. Methylamine solution (25 mL, 33 wt % in absolute ethanol, purchased from Sigma-Aldrich) was added to a three-neck flask (250 mL) maintained at a temperature lower than 7° C. Then, hydroiodic acid (10 mL, 57 wt % in water, purchased from Sigma-Aldrich) was added dropwise to the flask during steady stirring at 300 rpm. The white precipitate was recovered from the solution using a rotary evaporator under 60 torr at 50° C. Subsequently, the collected powder was dissolved in 10 mL of absolute ethanol, sonicated for 10 min, and then precipitated by adding 50 mL diethyl ether to the solution, followed by refrigerating for 20 min. After filtration, the process was repeated for 3 times, finally the white MAI powder was dried overnight using a Schlenk line under vacuum at 60° C.

MBI solution was prepared by mixing 0.2384 g of MAI and 0.5897 g of $BiI_3$ in 1 mL of anhydrous N, N-dimethylformamide (DMF, purchased from Sigma-Aldrich). The mixed solution was treated by ultra-sonication for 60 min and then filtered by PTFE syringe filters (0.45 µm, purchased from Tisch Scientific), generating a clear dark reddish solution. The prepared MBI solution was dispensed onto pre-heated substrate (100° C.) and spin-coated at 4,000 rpm for 30 s with a ramp rate of 2,000 rpm/s, followed by annealing at 100° C. for 30 min on a hotplate. An orange film was achieved after cooling down to room temperature. To obtain MBI powder, the MBI solution was transferred into a Petri dish, followed by heating at 100° C. to completely remove DMF residue. The collected orange powder was MBI powder.

Device Fabrication:

The Si wafer was pre-cleaned and heated in air at 1100° C. for 10 h using a Lindberg/Blue M 3-zone tube furnace to obtain thermal $SiO_2$ layer (300 nm) on Si wafer. The bottom Au/Cr (100 nm/5 nm) electrode was deposited on the surface of $SiO_2$/Si wafer by an Edwards Auto 306 Thermal Evaporator. The Au/Cr/$SiO_2$/Si substrate was then pre-washed by ethanol, acetone, isopropyl alcohol and DI water, and treated in a UV Ozone Cleaner (Ossila E511) for 15 min before spin-coating MBI film. The precursor MBI solution (100 µL) was deposited onto as-received substrate using the solution-based method mentioned above. Finally, 100 nm of top Al electrodes (squares with side of 50 µm) were deposited on the MBI film by a Kurt J. Lesker PVD 75 RF Magnetron Sputtering System through a shadow mask to accomplish the vertical Al/MBI/Au memory device.

To build a planar memory device, two separated Al electrodes were prepared on $SiO_2$/Si wafer by photolithography (Heidelberg DWL 66 Laser Lithography System), sputter deposition (Kurt J. Lesker PVD 75 RF Magnetron Sputtering System), and liftoff process. MBI film was deposited on the as-prepared substrate using the same solution-based method.

Characterization and Measurement:

MBI powders were subjected to X-ray diffraction measurements under 1 atm at room temperature using a Bruker D8 Advance X-ray Diffractometer at 40 kV and 40 mA for Cu Kα radiation, with a scan speed of 1°/min and a step size of 0.01° in 2θ. The SEM images and EDX spectra were evaluated by a field emission scanning electron microscope (FE-SEM, JEOL JSM-7001 LVF) equipped with an Oxford Aztec Live X-Max EDX spectrometer. The morphology and crystal structure of MBI film were investigated with a transmission electron microscopy (TEM, JEOL JEM-2000 FX). The absorption spectra of MBI film deposited onto indium tin oxide (ITO) coated glass substrates were measured using a UV-vis spectrophotometer (UV1800, Shimadzu). Raman spectra were depicted by a Renishaw inVia confocal Raman spectrometer mounted on a Leica microscope with a 50× objective and a 514 nm wavelength laser as an excitation source. X-ray photoelectron spectroscopy (XPS) spectra were collected using a PHI 5000 Versaprobe-II spectrometer with a photon energy of 1486.6 eV (Al Kα).

Electrical characterizations were carried out in a commercial variable temperature probe station (Janis ST500-1-2CX) with Cu—Be probe tips. The current-voltage characteristics were performed with a Keithley 2400 source meter; whereas the resistance response of frequency was measured using an Agilent E4980A LCR meter.

DFT Calculation

The first-principles modeling is based on density-functional theory (DFT) calculations, as implemented in the Vienna Ab initio Simulation Package, and the Perdew-Burke-Ernzerhof exchange-correlation functional was employed. The plane-wave energy cutoff was set to 400 eV and the projector augmented wave method was utilized with the following potentials: $H\_s(1s^1)$ for H, $C\_s(2s^22p^2)$ for C, $N\_s(2s^22p^3)$ for N, $Bi\_GW(6s^26p^3)$ for Bi, and $I\_GW(5s^25p^5)$ for I. The plane-wave energy cut-off was set to 340 eV. The supercell of a pristine bulk has a volume of 17.16×17.16×21.77 Å3 and 280 atoms. A gamma point is used for sampling the Brillouin zone. The structures are relaxed till the forces on each atom are less than 0.01 eV/Å. Activation barriers are calculated using the climbing-nudged elastic band method with three intermediate images. The defect formation energy of iodine vacancy $V_I$ with a charge state q is defined by Equation (3):

$$E_f(V_1^q,E_F)=E_{tot}(V_1^q)+E_{FNV}(V_1^q)+\mu_I+q[E_{VBM}(\text{bulk})+E_F]-E_{tot}(\text{bulk}) \quad (3)$$

Where $E_{tot}(V_1^q)$ and $E_{tot}(\text{bulk})$ are the total internal energy of the system with defect $V_I^q$ and perfect $MA_2Bi_2I_9$ bulk, respectively; $E_{FNV}$, $E_{VBM}$ and $E_F$ are the image charge correction energy obtained using the scheme proposed by Freysoldt, Neugebauer and Van de Walle (FNV) (C. Freysoldt, J. Neugebauer, C. G. Van de Walle, *Physical Review Letters*, 2009, 102, 016402), the valence band maximum energy, and the Fermi energy relative to VBM, respectively; the chemical potential of iodine, μI, is chosen to be the energy of bulk iodine under I-rich conditions and the energy difference between bulk $BiI_3$ and bulk Bi bulk under I-poor conditions.

This written description uses examples to discuss the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A memristor device comprising a methylammonium bismuth iodide $(CH_3NH_3)_3Bi_2I_9$ perovskite film.

2. The memristor device according to claim 1, wherein said perovskite film is prepared by atmospheric pressure chemical vapor deposition.

3. A resistive switching memory device comprising a $MA_3Bi_2I_9$ film.

4. The device of claim 3, wherein the device includes an ON/OFF ratio of up to $10^3$.

5. The device of claim 3, wherein the device has an SET voltage of about 0.15 V.

6. The device of claim 3, wherein the device lasts for at least about 1,000 cycles.

7. The device of claim 3, wherein the device comprises Al/MBI/Au.

* * * * *